(12) United States Patent
Takigawa et al.

(10) Patent No.: US 9,680,289 B2
(45) Date of Patent: Jun. 13, 2017

(54) LONG-LIFE, HIGH-EFFICIENCY LASER APPARATUS HAVING PLURALITY OF LASER DIODE MODULES

(71) Applicant: FANUC CORPORATION, Minamitsuru-gun, Yamanashi (JP)

(72) Inventors: Hiroshi Takigawa, Yamanashi (JP); Hisatada Machida, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/258,074

(22) Filed: Sep. 7, 2016

(65) Prior Publication Data

US 2017/0070031 A1    Mar. 9, 2017

(30) Foreign Application Priority Data

Sep. 9, 2015 (JP) .................................. 2015-177969

(51) Int. Cl.
```
H01S 3/00      (2006.01)
H01S 5/0683    (2006.01)
H01S 5/40      (2006.01)
H01S 5/042     (2006.01)
```

(52) U.S. Cl.
CPC .......... *H01S 5/0683* (2013.01); *H01S 5/042* (2013.01); *H01S 5/4025* (2013.01)

(58) Field of Classification Search
CPC ...... H01S 5/042; H01S 5/4012; H01S 5/0683; H01S 5/02469

USPC .................................................. 372/38.01, 36
See application file for complete search history.

(56) References Cited

FOREIGN PATENT DOCUMENTS

| JP | 4341600 | * | 10/2009 |
|---|---|---|---|
| JP | B-4341600 | | 10/2009 |
| JP | 2012-124304 | * | 6/2012 |
| JP | 2012-124304 A | | 6/2012 |
| JP | 5729107 | * | 6/2015 |
| JP | B-5729107 | | 6/2015 |

\* cited by examiner

*Primary Examiner* — Tuan Nguyen
(74) *Attorney, Agent, or Firm* — RatnerPrestia

(57) ABSTRACT

A laser apparatus includes laser diode module groups (LDMGs) and power supply units and provides a laser light source by collecting laser beam from the LDMGs, and comprises: a driving current supply circuit network for injecting the driving currents into the respective LDMGs, independently; a control unit which controls the driving currents independently; a first recording unit in which are recorded data representing a relationship between the driving current and optical output power, and data representing a relationship between the driving current and drive voltage; and a first calculating unit which calculates the driving currents to be allocated to the LDMGs so as to achieve maximum electrical to optical conversion efficiency, wherein the control unit allocates the driving currents to the LDMGs in accordance with the results calculated by the first calculating unit so that the LDMGs as a whole can achieve maximum electrical to optical conversion efficiency under conditions.

8 Claims, 15 Drawing Sheets

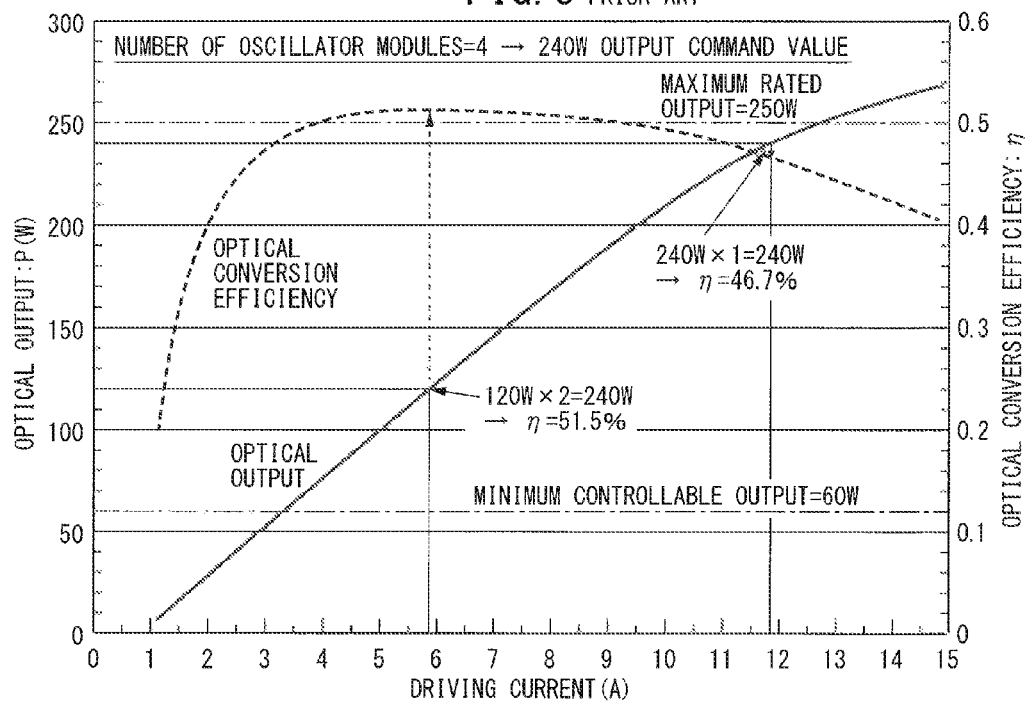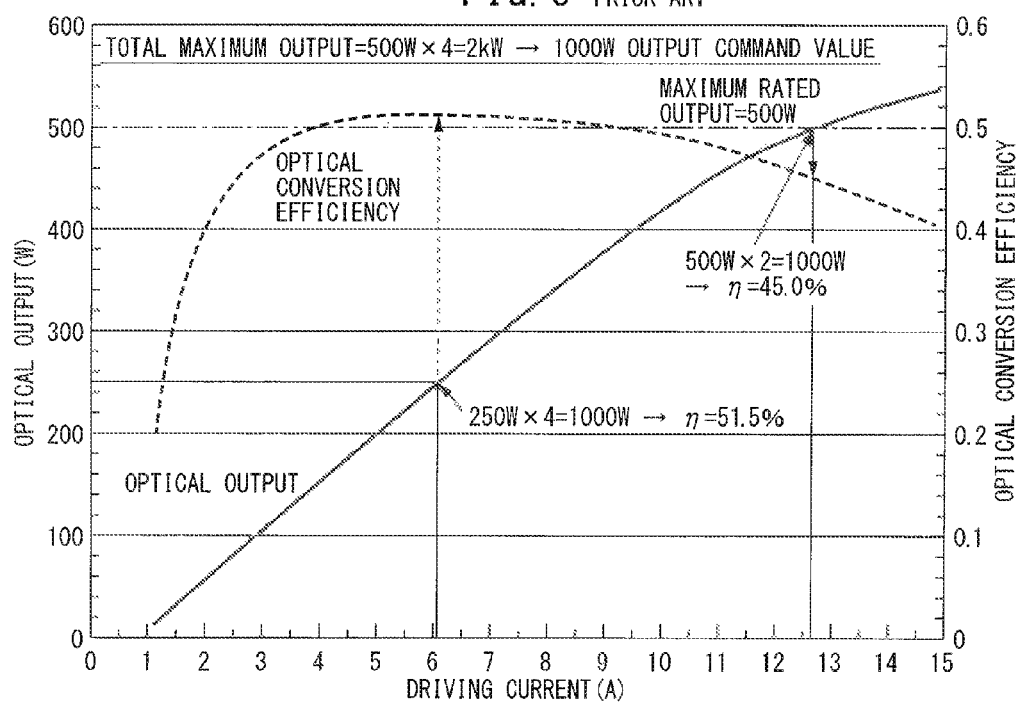

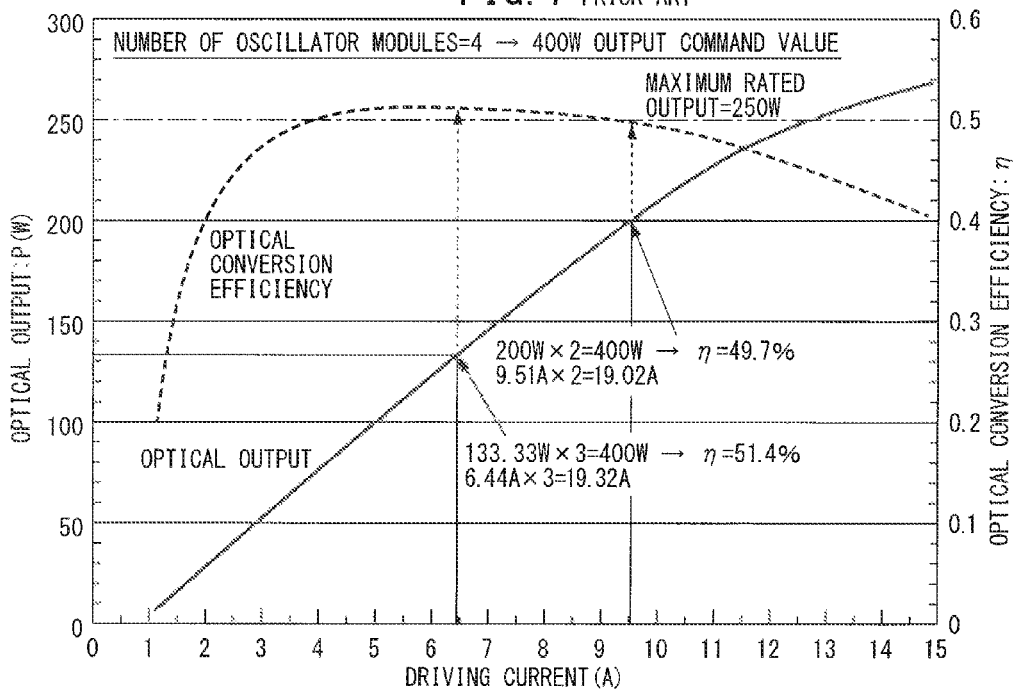
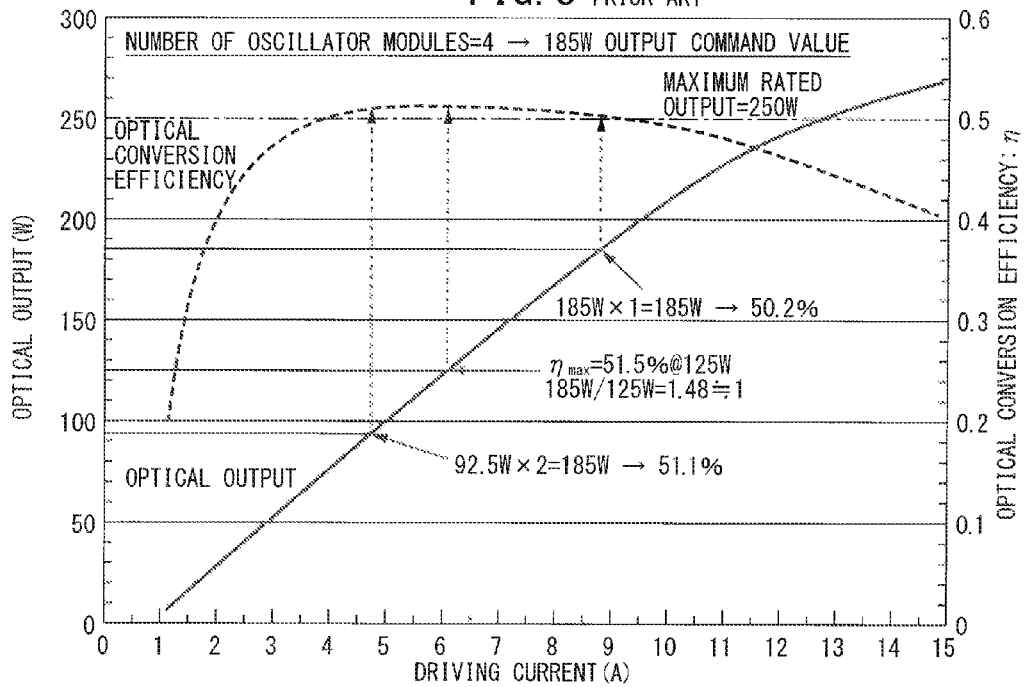

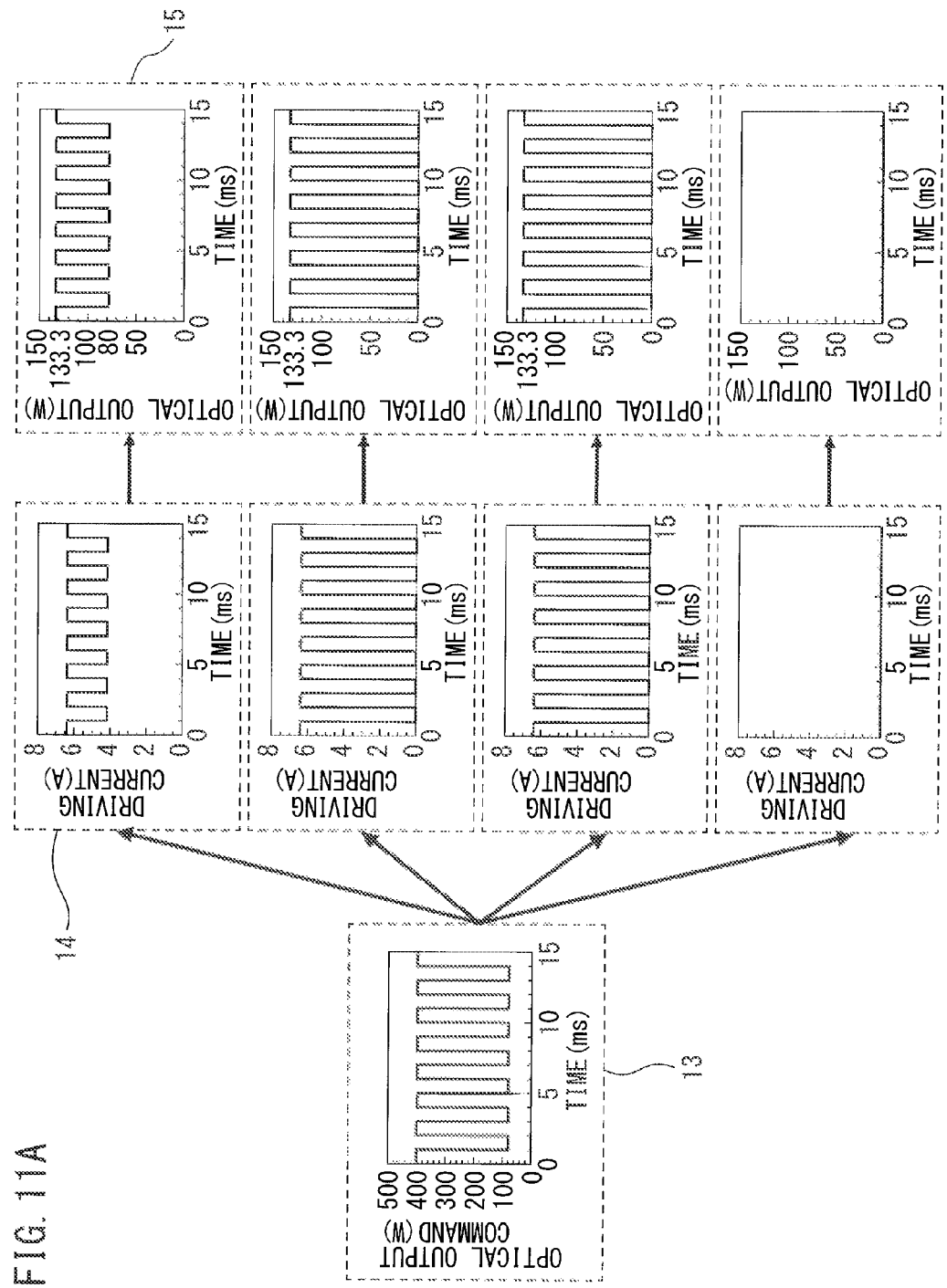

LONG-LIFE, HIGH-EFFICIENCY LASER APPARATUS HAVING PLURALITY OF LASER DIODE MODULES

This application is a new U.S. patent application that claims benefit of JP 2015-177969 filed on Sep. 9, 2015, the content of 2015-177969 is incorporated herein by reference.

BACKGROUND OF THE INVENTION

1. Field of the Invention

The present invention relates to a laser apparatus, and in particular to a laser apparatus that uses a plurality of laser diode modules to provide a light emitting source or a pumping light source.

2. Description of the Related Art

Many high-power laser apparatuses are equipped with a plurality of laser light source units in order to achieve high output power, and a variety of driving methods have been reported in the conventional art (for example, refer to Japanese Patent No. 5729107, hereinafter referred to as "patent document 1", Japanese Patent No. 4341600, hereinafter referred to as "patent document 2", and Japanese Unexamined Patent Publication No. 2012-124304, hereinafter referred to as "patent document 3").

Patent document 1 discloses a "laser oscillator control apparatus for controlling a laser oscillator constructed from a plurality of oscillator modules, each adapted to be driven to oscillate a laser beam". The laser oscillator is configured to produce an output power by collecting the laser beams oscillated by the plurality of oscillator modules, wherein the apparatus includes a module selecting means for selecting the oscillator modules to be driven. The module selecting means includes a selection criterion identifying unit which reduces the number of oscillator modules to be driven, by deciding not to drive all the oscillator modules when the value to be output power per oscillator module, calculated by dividing the output power of a laser beam machine required for laser processing by the number of oscillator modules, is smaller than the minimum controllable output power of each individual oscillator module. Patent document 1 also discloses a "laser oscillator control apparatus wherein when the output of the laser beam machine required for laser processing is not larger than the maximum rated output power of each individual oscillator module, the selection criterion identifying unit reduces the number of oscillator modules to be driven to one by deciding not to drive all of the oscillator modules."

When the oscillator module light emitting source is a laser diode module, the optical output power versus the driving current injected into the laser diode module has a characteristic such as shown in FIG. 1, and the voltage applied to the laser diode module versus the driving current has a characteristic such as shown in FIG. 2. As a result, electrical to optical conversion efficiency exhibits a peak at a given driving current, as shown in FIG. 3, and thus the electrical to optical conversion efficiency has a shape asymmetrical with respect to that given current. Accordingly, with the selection criterion described in patent document 1, it is not always possible to drive the laser diode module under conditions where the electrical to optical conversion efficiency is highest. Suppose, for example, that there are a total of four oscillator modules, each having an optical output power characteristic, current-voltage characteristic, and electrical to optical conversion efficiency characteristic, such as shown in FIGS. 1 to 3, respectively, and having a maximum rated output of 250 W and a minimum controllable output of 60 W. In this case, when the optical output power command value is 260 W, the condition for reducing the number of oscillator modules to be driven is not yet met in patent document 1. As a result, all the four oscillator modules are driven, each with an output of 65 W. However, as can be seen from FIG. 4, it is clear that the electrical to optical conversion efficiency is higher when only two modules are driven, each with an output of 130 W.

On the other hand, when the optical output power command value is 240 W, since the command value is less than the maximum rated output power of each individual oscillator module, only one oscillator module should be driven according to the latter selection criterion that defines that "when the output of the laser beam machine required for laser processing is not larger than the maximum rated output of each individual oscillator module, the selection criterion identifying unit reduces the number of oscillator modules to be driven to one by deciding not to drive all the oscillator modules." However, as can be seen from FIG. 5, it is clear that the electrical to optical conversion efficiency is higher when two modules are driven. FIG. 4 in patent document 1 shows examples of calculations performed by the laser module selecting means. For example, case 1 assumes four laser modules each having a maximum output of 500 W. It is described that when the output command value from the processing condition is 1000 W, two laser modules are selected and driven, each with an output of 500 W. However, in the case of laser modules having optical output power characteristics such as shown in FIG. 6, it is clear that the electrical to optical conversion efficiency is higher when all the four modules are selected and driven, each with an output of 250 W. That is, according to patent document 1, when the oscillator module light emitting sources are laser diode modules, there is no guarantee that the modules can always be driven with the highest electrical to optical conversion efficiency.

Further, in patent document 1, it is described that "still another object of the present invention is to reduce the number of oscillator modules to be selected only when effective and thereby to prevent durability from decreasing due to concentrated use of a limited number of oscillator modules." That is, by avoiding driving a limited number of oscillator modules wherever possible and thereby avoiding applying loads to the limited number of oscillator modules, the life of such oscillator modules, and hence the life of the laser apparatus as a whole, is prevented from being reduced. However, no essential solution is presented to address the problem that the life becomes shorter due to concentrated use of a limited number of oscillator modules. As a result, depending on the processing conditions, a limited number of oscillator modules may continue to be used in a concentrated manner, eventually resulting in the problem that the life of such oscillator modules comes to an end earlier than the life of the other oscillator modules.

Patent document 2 discloses a "solid-state laser apparatus comprising a current distributing means for determining the distribution of current to a pumping light source for each pumping module so that the output measured by an output measuring means becomes maximum under the condition that the total sum of the currents to the pumping light sources of the pumping modules is maintained constant." This driving condition can be interpreted as distributing the currents so that the total sum of the currents to the pumping light sources becomes minimum, in order to provide a prescribed output. Consider the case where each light source is a laser diode module and each oscillator module has an optical output power characteristic, current-voltage characteristic, and electrical to optical conversion efficiency characteristic, such as shown in FIGS. 1 to 3, respectively, and a maximum rated output of 250 W. Suppose that the number of oscillator modules is four; then, when the optical output power command value is 400 W, the total sum of the currents is smaller when two oscillator modules are driven, but the electrical to optical conversion efficiency is higher when three oscillator modules are driven, as shown in FIG. 7. That is, according to patent document 2, when the oscillator module light emitting sources are laser diode modules, there is no guarantee that the modules can always be driven with the highest electrical to optical conversion efficiency.

Patent document 3 discloses in claim 5 a "method for controlling a high-power two-dimensional surface-emitting laser array, wherein in light source units each comprising one or a plurality of independently controllable high-power two-dimensional surface-emitting laser array elements, the number of light source units to be driven is calculated by dividing the required optical output power by the maximum efficiency optical output power prestored as maximizing the electrical to optical conversion efficiency and by rounding the result, a unit optical output power for each light source unit is calculated by dividing the required optical output power by the number of light source units to be driven, an optical output power difference is calculated between the unit optical output power and the maximum efficiency optical output power, a corrective driving current corresponding to the optical output power difference is calculated from the linear relationship that the optical output power has with respect to a variation in the driving current of the high-power two-dimensional surface-emitting laser array, and the surface-emitting laser array is driven with a driving current obtained by correcting the maximum efficiency optical output power by the corrective driving current." "Dividing the required optical output power by the maximum efficiency optical output power that maximizes the electrical to optical conversion efficiency and rounding the result" in the above description is described in mode for carrying out the invention that "as a method of rounding the value, the value should simply be rounded to the nearest integer." By taking the above driving condition into account, the following case is considered: each light source is a laser diode module; each oscillator module has an optical output power characteristic, current-voltage characteristic, and electrical to optical conversion efficiency characteristic, such as shown in FIGS. 1 to 3, respectively, and has a maximum rated output of 250 W; the maximum efficiency optical light output power that maximizes the electrical to optical conversion efficiency is 125 W; and the number of oscillator modules is four. In this case, when the optical output power command value is 185 W, the number of light source units to be driven is calculated as 185 W÷125 W=1.48≈1, and the laser array is driven with a driving current of 8.79 A obtained by correcting by the corrective driving current. However, as shown in FIG. 8, the electrical to optical conversion efficiency is higher when two oscillator modules are driven to produce a total output of 185 W. That is, according to patent document 3, when the oscillator module light emitting sources are laser diode modules, there is no guarantee that the modules can always be driven with the highest electrical to optical conversion efficiency. Furthermore, in patent document 3, the corrective driving current is obtained by using the linear relationship that the optical output power has with respect to a variation in the driving current. However, in the case of high-power laser diode modules, the modules are often driven within a high optical output power driving current region where the optical output power does not vary linearly with the driving current. As a result, when the corrective driving current is obtained using the linear relationship, there arises the problem that the optical output power is not produced with the required accuracy in response to the optical output power command value.

SUMMARY OF THE INVENTION

High-power laser apparatus that use laser diodes having high electrical to optical conversion efficiency as laser light emitting sources or laser pumping light sources have come to be used widely in a variety of processing fields. When the optical output power is large, power consumption is also large, and it is therefore desirable that the laser apparatus be driven under conditions of the highest possible electrical to optical conversion efficiency. However, with the conventional art, it has not always been possible to drive such laser apparatus under conditions of the highest electrical to optical conversion efficiency over a wide optical output power command range. Furthermore, in the case of a laser apparatus constructed from a plurality of oscillator modules in order to achieve high output power, if the driving condition is changed for each oscillator module in order to drive it with high electrical to optical conversion efficiency, there arises the problem that the load due to driving is concentrated on a limited number of oscillator modules, resulting in variations in remaining life among the oscillator modules with some of the oscillator modules coming to the end of their life earlier than the others, and thus reducing the life of the laser apparatus as a whole.

There is therefore a need to develop a laser apparatus that is driven so as to always achieve maximum electrical to optical conversion efficiency, with provisions made to avoid concentrating the driving load on a limited number of oscillator modules and to extend the life of the laser apparatus as long as possible.

According to one embodiment of the present invention, there is provided a laser apparatus which includes a plurality of laser diode module groups each containing at least one laser diode module, and a plurality of power supply units each for supplying a driving current to a corresponding one of the plurality of laser diode module groups, and which provides a laser light source or a pumping light source for laser oscillation by collecting laser beam from the plurality of laser diode module groups. The laser apparatus comprises a driving current supply circuit network, a control unit, a first recording unit, and a first calculating unit. The driving current supply circuit network is capable of injecting the driving currents from the plurality of power supply units into the plurality of respective laser diode module groups, independently for each of the plurality of laser diode module groups. The control unit controls the driving currents to be injected from the plurality of power supply units into the plurality of respective laser diode module groups, independently for each of the plurality of laser diode module groups. The first recording unit records optical output power characteristic data representing a relationship between the driving current and optical output power for each of the plurality of laser diode module groups and current-voltage characteristic data representing a relationship between the driving current and driving voltage for each of the plurality of laser diode module groups. In response to a laser beam output power command value to the laser apparatus, the first calculating unit calculates the driving currents to be allocated to the plurality of respective laser diode module groups so that the plurality of laser diode module groups as a whole can achieve maximum or substantially maximum electrical to optical conversion efficiency, the electrical to optical conversion efficiency representing energy conversion efficiency from injected power to optical output power, under conditions where the commanded optical output power can be obtained. In response to the laser beam output power command value to the laser apparatus, the control unit allocates the driving currents to the plurality of respective laser diode module groups in accordance with results calculated by the first calculating unit based on the data recorded in the first recording unit so that the plurality of laser diode module groups as a whole can achieve maximum or substantially maximum electrical to optical conversion efficiency under conditions where the commanded optical output power can be obtained.

BRIEF DESCRIPTION OF THE DRAWINGS

The above and other objects, features, and advantages of the present invention will become more apparent from the description of the preferred embodiments as set forth below with reference to the accompanying drawings, wherein:

FIG. 5 is a diagram showing a second example of a graphical representation of the optical output power and electrical to optical conversion efficiency versus the driving current in a laser diode module group according to the conventional art, illustrating that there are cases where the modules are not driven with the highest electrical to optical conversion efficiency;

FIG. 6 is a diagram showing a third example of a graphical representation of the optical output power and electrical to optical conversion efficiency versus the driving current in a laser diode module group according to the conventional art, illustrating that there are cases where the modules are not driven with the highest electrical to optical conversion efficiency;

FIG. 7 is a diagram showing a fourth example of a graphical representation of the optical output power and electrical to optical conversion efficiency versus the driving current in a laser diode module group according to the conventional art, illustrating that there are cases where the modules are not driven with the highest electrical to optical conversion efficiency;

FIG. 8 is a diagram showing a fifth example of a graphical representation of the optical output power and electrical to optical conversion efficiency versus the driving current in a laser diode module group according to the conventional art, illustrating that there are cases where the modules are not driven with the highest electrical to optical conversion efficiency;

FIG. 11A is a diagram for explaining a laser apparatus according to a second embodiment of the present invention, showing an example of an optical output power command waveform applied to the laser apparatus and an example of how the driving current is allocated to each individual laser diode module;

DETAILED DESCRIPTION

Laser apparatus according to the present invention will be described below with reference to the drawings.

First Embodiment

Figure 9:
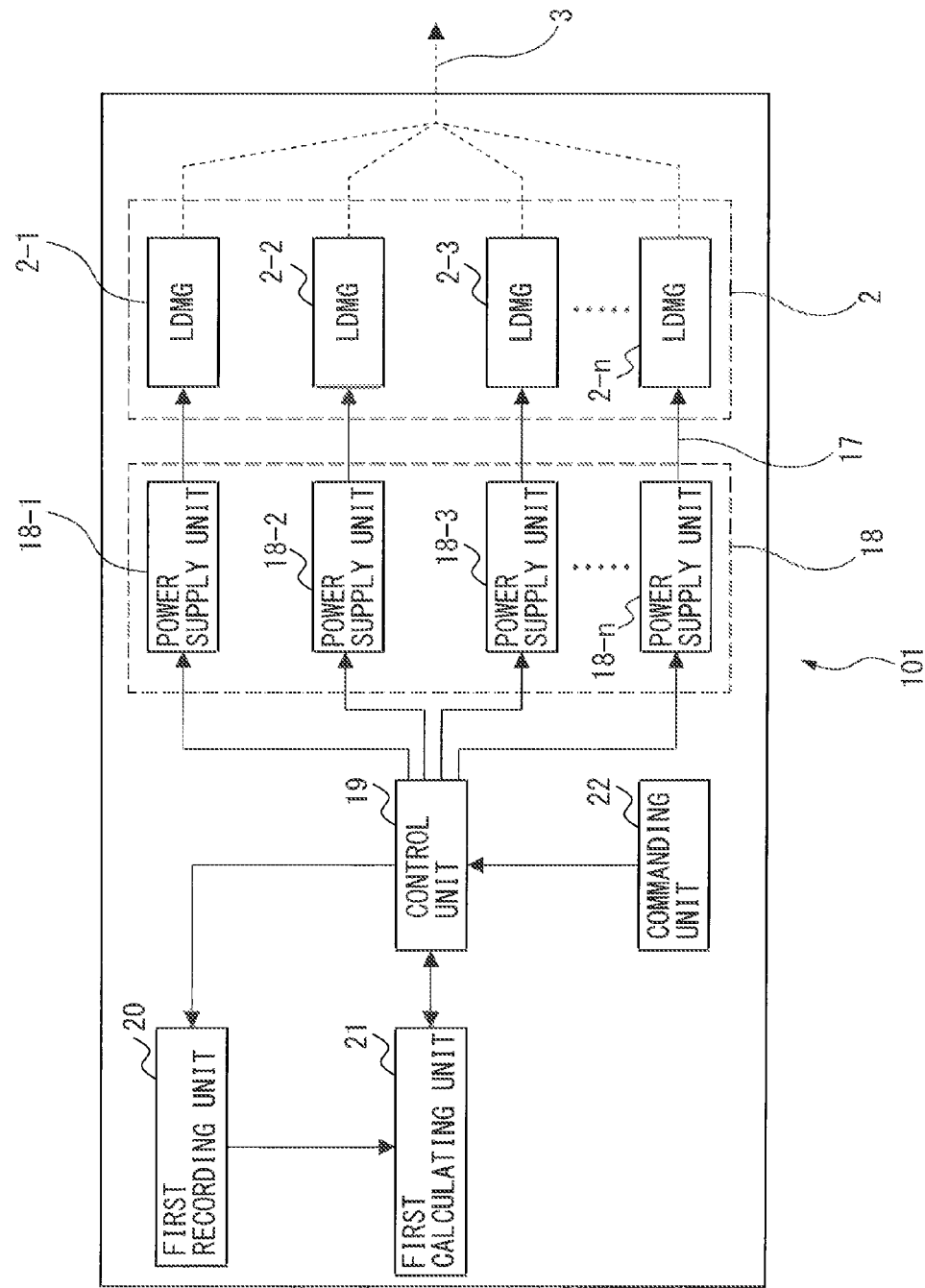
FIG. 9 is a schematic diagram showing the configuration of a laser apparatus according to a first embodiment of the present invention for the case where the number of laser diode module groups (LDMGs) is n.

FIG. 9 is a schematic diagram showing the configuration of a laser apparatus according to a first embodiment of the present invention. The laser apparatus 101 of the present embodiment is a laser apparatus which includes a plurality of laser diode module groups 2 each containing at least one laser diode module, and a plurality of power supply units 18 each for supplying a driving current to a corresponding one of the plurality of laser diode module groups 2, and which provides a laser light source or a pumping light source for laser oscillation by collecting laser beam 3 from the plurality of laser diode module groups 2. The laser apparatus 101 comprises a driving current supply circuit network 17, a control unit 19, a first recording unit 20, and a first calculating unit 21. The driving current supply circuit network 17 is capable of injecting the driving currents from the plurality of power supply units 18 into the plurality of respective laser diode module groups 2, independently for each of the plurality of laser diode module groups. The control unit 19 controls the driving currents to be injected from the plurality of power supply units 18 into the plurality of respective laser diode module groups 2, independently for each of the plurality of laser diode module groups. The first recording unit 20 records optical output power characteristic data representing a relationship between the driving current and optical output power for each of the plurality of laser diode module groups 2 and current-voltage characteristic data representing a relationship between the driving current and driving voltage for each of the plurality of laser diode module groups 2. In response to a laser beam output power command value to the laser apparatus, the first calculating unit 21 calculates the driving currents to be allocated to the plurality of respective laser diode module groups 2 so that the plurality of laser diode module groups 2 as a whole can achieve maximum or substantially maximum electrical to optical conversion efficiency. The electrical to optical conversion efficiency represents energy conversion efficiency from injected power to optical output power, under conditions where the commanded optical output power can be obtained.

The laser beam output power command value may be given to the control unit 19 from a commanding unit 22 provided within the laser apparatus 101, as shown in FIG. 9, or may be given from outside the laser apparatus 101.

The laser diode module groups (LDMGs) each contain at least one laser diode module (LDM). The laser diode module groups are units configured so that the driving currents to be injected from the plurality of power supply units 18 into the plurality of respective laser diode module groups 2 can be controlled independently for each of the laser diode module groups. The laser diode module groups are also units each of which contains at least one laser light source unit that can output laser beam of the same quality as the laser beam output from the laser apparatus, even when a driving current within a proper range is injected into only one of the plurality of laser diode module groups. The laser beam of the same quality means laser beam having at least substantially the same wavelength.

In FIG. 9, a number, n, of laser diode module groups, for example, are provided, and these n laser diode module groups (2-1, 2-2, 2-3, . . . , 2-n) are collectively represented by reference numeral 2.

Similarly, in FIG. 9, a number, n, of power supply units, for example, are provided to correspond with the number of laser diode module groups, and these n power supply units (18-1, 18-2, 18-3, . . . , 18-n) are collectively represented by reference numeral 18. The driving current supply circuit network 17 is a collection of wiring lines that connect the n power supply units to the corresponding n laser diode module groups.

Figure 10:
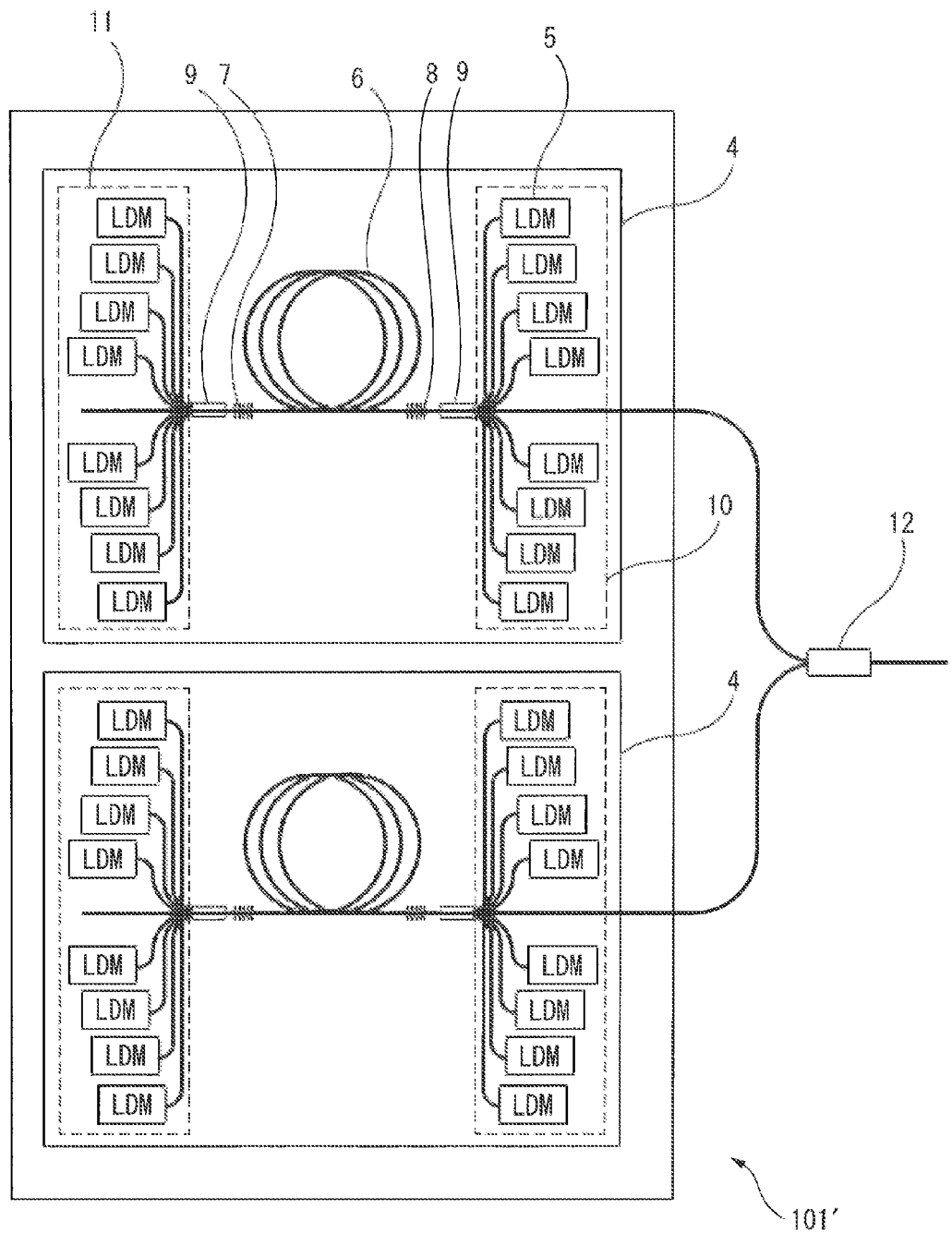
FIG. 10 is a diagram for explaining an example of how the laser diode module groups are arranged when each laser diode module is used as a pumping light source for a fiber laser.

In the laser apparatus 101 of the present embodiment, the control unit 19 has the function of allocating, in response to the laser beam output power command to the laser apparatus 101, the driving currents to the plurality of respective laser diode module groups 2 in accordance with the results calculated by the first calculating unit 21 based on the data recorded in the first recording unit 20 so that the plurality of laser diode module groups 2 as a whole, that is, the laser apparatus 101 as a whole, can achieve maximum or substantially maximum electrical to optical conversion efficiency under conditions where the commanded optical output power can be obtained. In the case of a laser apparatus of a direct diode type that collects the laser beam from the laser diodes and that outputs the laser beam from the laser apparatus without changing the wavelength, the laser diode module group is simply a collection of laser diode modules equipped with some kind of light-gathering optics. In the case of a laser apparatus 101' that excites fiber laser with laser beam from laser diode modules, as shown in FIG. 10, if the driving current to be injected can be controlled independently, fiber laser units 4 connected to a beam combiner 12 may each be configured to form a laser diode module group. Alternatively, a backward pumping laser diode module group 11 and a forward pumping laser diode module group 10 may each be configured to form a laser diode module group. Further alternatively, the pumping laser diode module groups 10 and 11 may each be further divided into laser diode modules (LDMs) 5 to form laser diode groups. The forward pumping laser diode module group 10 and the backward pumping laser diode module group 11 can be connected by an active-element-doped optical fiber 6 via a high-reflectivity fiber Bragg grating 7, a low-reflectivity fiber Bragg grating 8, and pumping light combiners 9. However, when each fiber laser unit 4 is divided into a plurality of laser diode module groups, if the efficiency of optical-to-optical conversion from the pumping light power produced by each individual laser diode module 5 to the laser light power to be output from the fiber laser is not constant, the allocation of the driving currents for maximizing the electrical to optical conversion efficiency should be calculated in the following manner. That is, in this case, optical-to-optical conversion efficiency data should be recorded in the first recording unit 20 in which are recorded the optical output power characteristic data representing the relationship between the driving current and optical output power for each laser diode module group and the current-voltage characteristic data representing the relationship between the driving current and driving drive voltage for each laser diode module group, and the allocation of the driving currents for maximizing the electrical to optical conversion efficiency should be calculated by correcting the optical output power command value for each laser diode module so as to be able to produce a correct optical output power in response to the optical output power command value. If the actual data recorded in the first recording unit 20 are data for discrete currents, data for any current value not stored in the table can be easily calculated by interpolation.

The method of calculating the allocation of the driving currents for maximizing the electrical to optical conversion efficiency is not limited to one particular method. As an example, first, when the number of laser diode module groups is n, the electrical to optical conversion efficiency expected to be achieved when each laser diode module group equally allocates the optical output power command value is calculated for the case where only one group is selected, for the case where two groups are selected, . . . , for the case where n−1 groups are selected, and for the case where n groups are selected, in sequence in the order of the laser diode module groups in response to the optical output power command value entered from the commanding unit on a control panel or the like. Next, for the laser diode module group having the highest electrical to optical conversion efficiency, the driving current is increased and decreased within a range that does not exceed the maximum rated optical output power of each individual laser diode module, and if the optical output power has increased or decreased correspondingly, the driving current is adjusted so that the optical output power(s) of the other selected laser diode module group(s) equally decreases or increases. When the maximum electrical to optical conversion efficiency is attained, the driving current for the laser diode module group having the highest electrical to optical conversion efficiency is temporarily fixed. Next, the driving current is increased and decreased for the laser diode module group having the next highest electrical to optical conversion efficiency, and if the optical output power has increased or decreased correspondingly, the driving current is adjusted so that the optical output power(s) of the remaining selected laser diode module group(s) equally decreases or increases. When the maximum electrical to optical conversion efficiency is attained, the driving current for the laser diode module group having the next highest electrical to optical conversion efficiency is temporarily fixed. This calculation process is repeated until the driving current for the laser diode module group having the next lowest electrical to optical conversion efficiency among the selected laser diode groups is temporarily fixed. After that, the driving current is increased and decreased once again for the laser diode module group having the highest electrical to optical conversion efficiency, and if the optical output power has increased or decreased correspondingly, the driving current is adjusted so that the optical output power(s) of the other selected laser diode module group(s) equally decreased or increases. Further, in the same manner as described above, the calculation process is repeated until the driving current for the laser diode module group having the next lowest electrical to optical conversion efficiency is temporarily fixed. By repeating this calculation process for several cycles, the allocation of the driving currents to the respective laser diode module groups that achieves substantially the highest electrical to optical conversion efficiency can be calculated.

Figure 4:
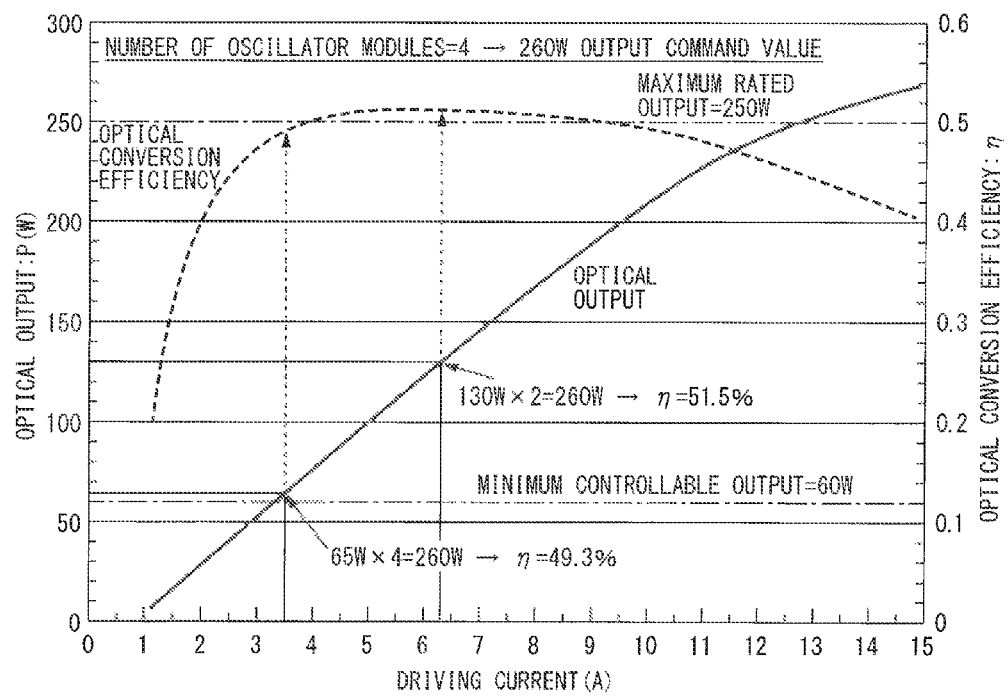
FIG. 4 is a diagram showing a first example of a graphical representation of the optical output power and electrical to optical conversion efficiency versus the driving current in a laser diode module group according to the conventional art, illustrating that there are cases where the modules are not driven with the highest electrical to optical conversion efficiency.

When there are no substantial differences in optical output power characteristic and current-voltage characteristic among the laser diode module groups, the electrical to optical conversion efficiency expected to be achieved when each laser diode module group equally allocates the optical output power command value is calculated for the case where only one laser diode module group is selected, for the case where two groups are selected, . . . , for the case where n−1 groups are selected, and for the case where n groups are selected. Next, the number that yielded the highest electrical to optical conversion efficiency is selected, and the driving current may then be allocated to each selected laser diode module group so as to produce an optical output power calculated by dividing the optical output power command value by the selected number of laser diode module groups. Specific calculation examples are given below: As a first example, for the output command value of 260 W described in FIG. 4, a driving current of 6.29 A is allocated to each of two laser diode module groups selected from the four laser diode module groups each with a maximum rated optical output power of 250 W, and a total optical output power of 260 W is produced with 130 W×2 with an electrical to optical conversion efficiency of 51.5%. As a second example, for the output command value of 240 W described in FIG. 5, a driving current of 5.86 A is allocated to each of two laser diode module groups selected from the four laser diode module groups each with a maximum rated optical output power of 250 W, and a total optical output power of 240 W is produced with 120 W×2 with an electrical to optical conversion efficiency of 51.5%. As a third example, for the output command value of 1000 W described in FIG. 6, a driving current of 6.07 A is allocated to each of the four laser diode module groups each with a maximum rated optical output power of 500 W, and a total optical output power of 1000 W is produced with 250 W×4 with an electrical to optical conversion efficiency of 51.5%. As a fourth example, for the output command value of 400 W described in FIG. 7, a driving current of 6.44 A is allocated to each of three laser diode module groups selected from the four laser diode module groups each with a maximum rated optical output power of 250 W, and a total optical output power of 400 W is produced with 133.33 W×3 with an electrical to optical conversion efficiency of 51.4%. As a fifth example, for the output command value of 185 W described in FIG. 8, a driving current of 4.67 A is allocated to each of two laser diode module groups selected from the four laser diode module groups each with a maximum rated optical output power of 250 W, and a total of optical output power of 185 W is produced with 92.5 W×2 with an electrical to optical conversion efficiency of 51.1%.

The above calculations can be accomplished in a short time using a state-of-the-art high-performance processor. However, when output control of microsecond order is needed, the results calculated for all possible output command values within an expected range may be stored in advance, for example, in the first recording unit 20, and when an output command value is issued, the allocation of the driving current to each laser diode module group may be determined by referring to the stored calculation results. Since the control unit 19 controls the power supply units 18-1, 18-2, 18-3, . . . , 18-*n* so that the driving currents, determined based on the calculation results from the first calculating unit 21 or on the prestored calculation results, are allocated to the respective laser diode module groups 2-1, 2-2, 2-3, . . . , 2-*n* in response to the optical output power command value, the laser apparatus is always driven with the maximum electrical to optical conversion efficiency.

Further, according to the driving current allocation method of the first embodiment, when there are differences in electrical to optical conversion efficiency among the laser diode module groups, usually a laser diode module group that has lower electrical to optical conversion efficiency and thus tends to have a shorter life has a lower probability of being selected as a laser diode module group to which the driving current is to be allocated; this offers the advantage of reducing the effects of the differences in life that may exist among the individual laser diode module groups.

Second Embodiment

Figure 11B:
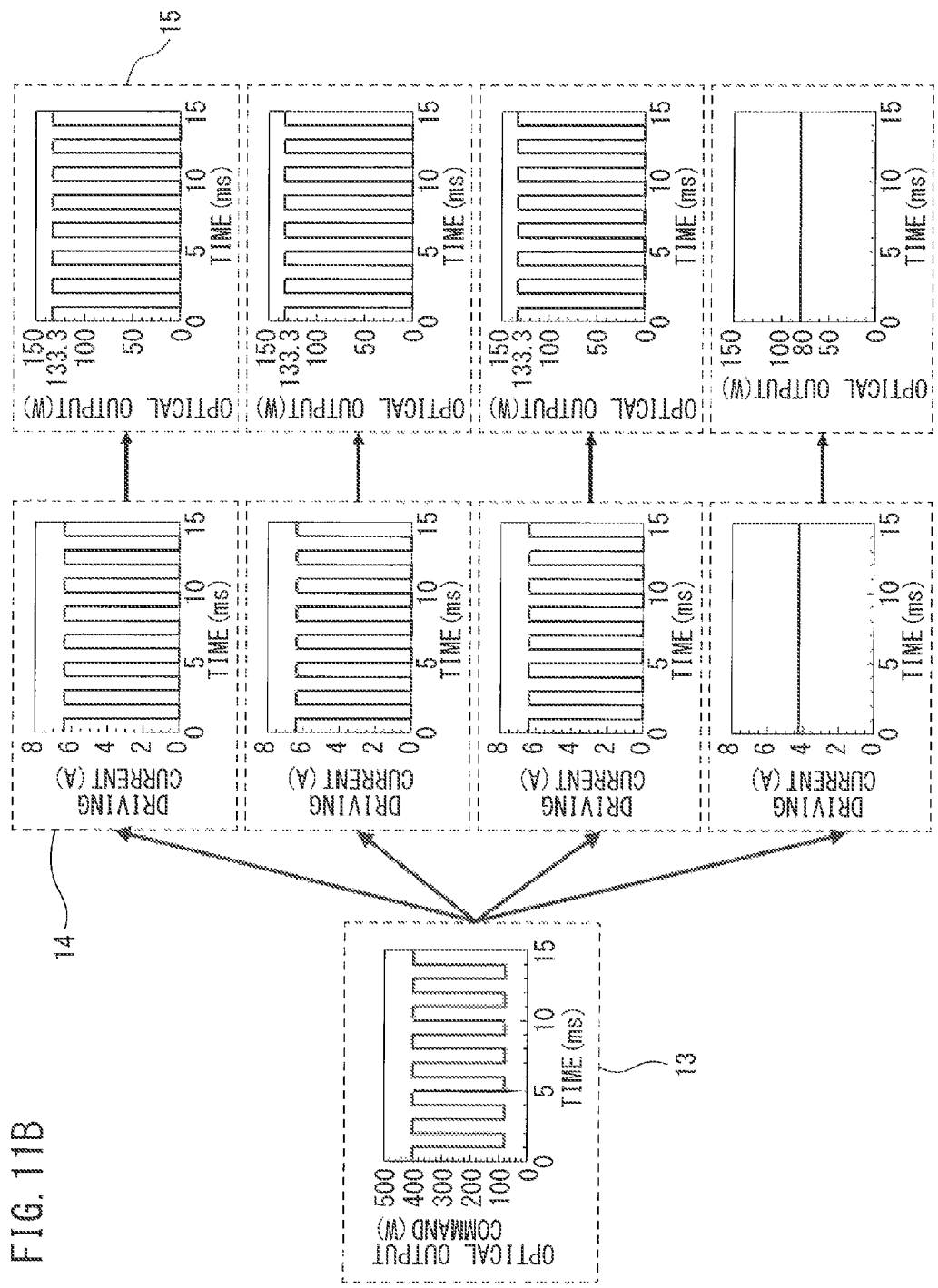
FIG. 11B is a diagram for explaining the laser apparatus according to the second embodiment of the present invention, showing an example of an optical output power command waveform applied to the laser apparatus and an example of how the driving current is allocated to each individual laser diode module.

FIGS. 11A and 11B are diagrams for explaining a laser apparatus according to a second embodiment of the present invention, showing an example of a pulse output command waveform 13 applied to the laser apparatus, an example of a driving current waveform 14 allocated to each individual laser diode module, and an example of an optical output power waveform 15 output from each individual laser diode module. A description will be given for the case where the laser beam output power command 13 to the laser apparatus is a pulse output command such that the optical output power alternates cyclically between a high output power level and a low output power level, as shown in FIGS. 11A and 11B. In this case, the control unit allocates the driving currents to the plurality of respective laser diode module groups so that the plurality of laser diode module groups as a whole can achieve maximum or substantially maximum electrical to optical conversion efficiency under conditions where the commanded optical output power can be obtained, whether the optical output power is a high output power level or a low output power level, and in this way, it becomes possible to achieve a laser apparatus that is always driven with the maximum electrical to optical conversion efficiency.

Figure 1:
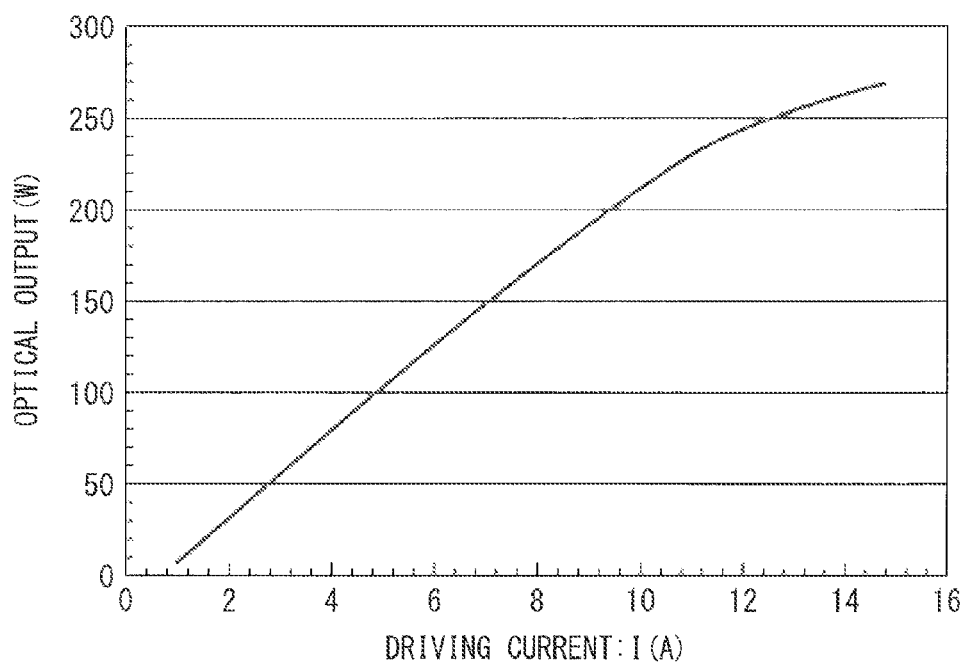
FIG. 1 is a diagram showing an example of an optical output power characteristic by plotting the magnitude of optical output power as a function of driving current in a laser diode module group.
Figure 2:
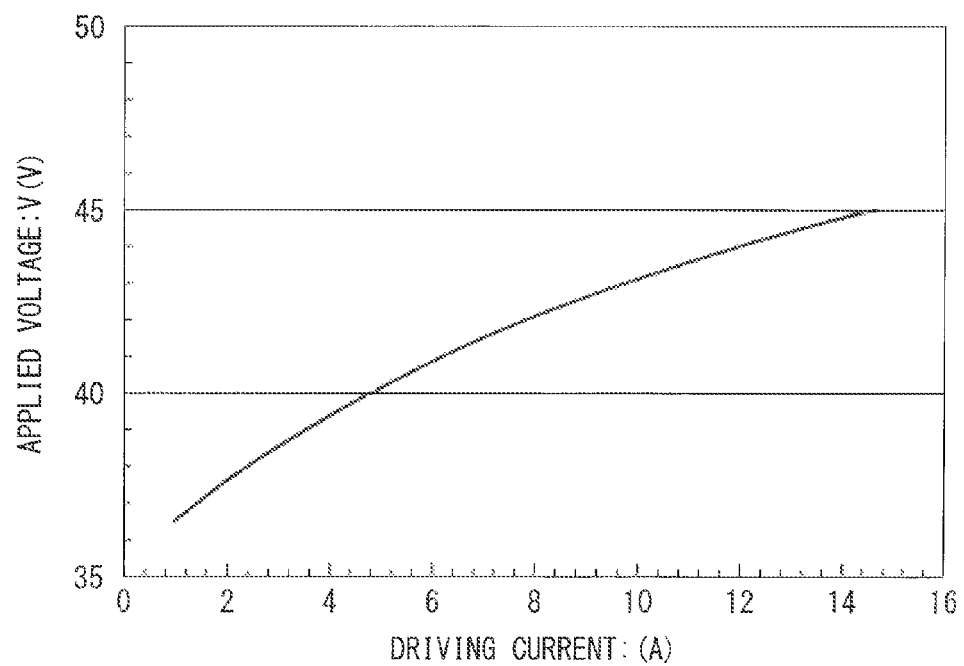
FIG. 2 is a diagram showing an example of a current-voltage characteristic by plotting the magnitude of applied voltage as a function of driving current in a laser diode module group.
Figure 3:
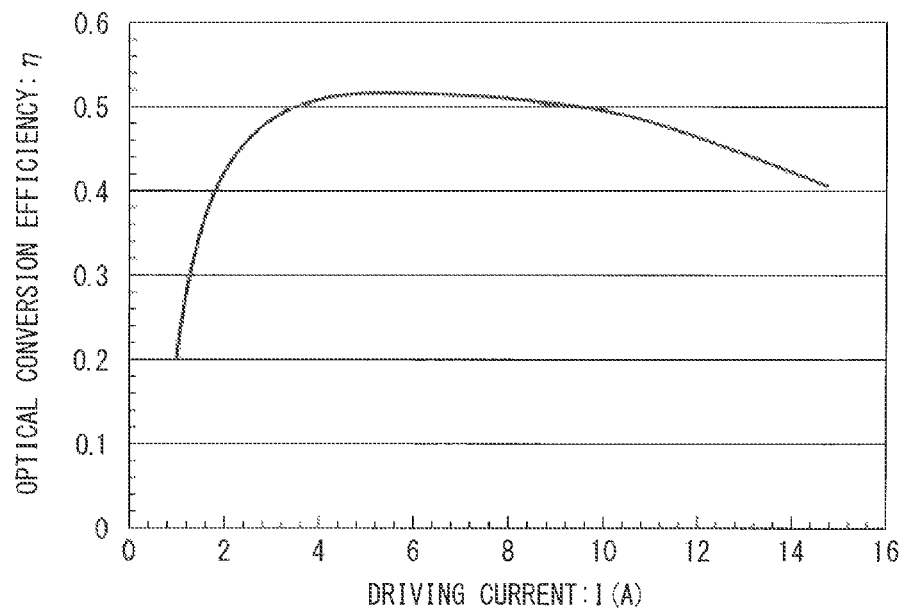
FIG. 3 is a diagram showing the variation in electrical to optical conversion efficiency with the driving current in the laser diode module group, which is calculated from the characteristics shown in FIGS. 1 and 2.

More specifically, suppose that the laser apparatus is used that comprises four laser diode module groups each having the optical output power and current-voltage characteristics shown in FIGS. 1 to 3 and a maximum rated optical light output power of 250 W. In this case, it is assumed that, in the pulse output command waveform, the high output power level is 400 W and the low output power level is 80 W, as shown in FIGS. 11A and 11B. To obtain an output of 400 W, if three laser diode module groups are driven with 133.33 W each, i.e., a total of 400 W, the apparatus can be driven with the highest electrical to optical conversion efficiency of 51.4%. On the other hand, to obtain an output of 80 W, if one laser diode module group is driven with 80 W, the apparatus can be driven with the highest electrical to optical conversion efficiency of 50.6%. Accordingly, the two driving current allocation schemes shown in FIGS. 11A and 11B for the laser diode module groups are the allocation schemes that can obtain the maximum electrical to optical conversion efficiency. If the optical output power and current-voltage characteristics shown in FIGS. 1 to 3 are exactly the same for all of the laser diode module groups, then the electrical to optical conversion efficiency obtained by the two driving current allocation schemes should be the same. However, if there are differences in the optical output power and current-voltage characteristics, the electrical to optical conversion efficiency obtained by the two driving current allocation schemes will differ between the two driving current schemes, in which case the combination that achieves the higher electrical to optical conversion efficiency should be selected.

As described above, according to the laser apparatus of the second embodiment of the present invention, the laser diode module groups as a whole, and hence the laser apparatus, can be driven with the maximum electrical to optical conversion efficiency, even when the laser beam output power command to the laser apparatus is a pulse output command such that the optical output power alternates cyclically between a high output power level and a low output power level.

Third Embodiment

Figure 12:
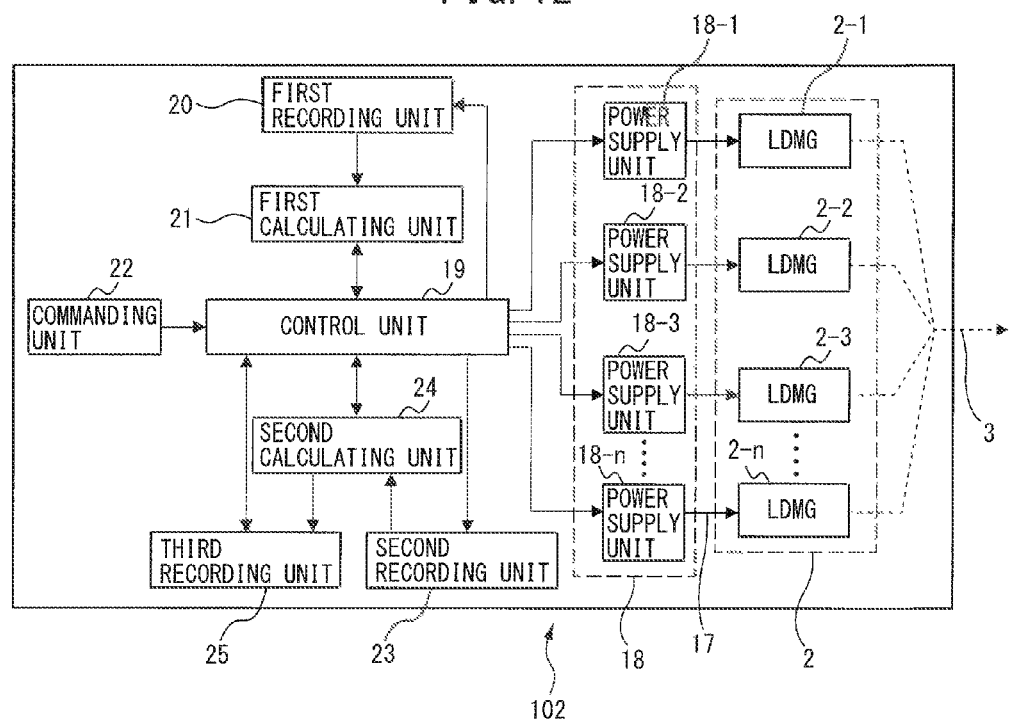
FIG. 12 is a schematic diagram showing the configuration of a laser apparatus according to a third embodiment of the present invention.

FIG. 12 is a schematic diagram showing the configuration of a laser apparatus for explaining a laser apparatus 102 according to a third embodiment of the present invention.

The laser apparatus 102 according to the third embodiment of the present invention comprises a second recording unit 23, a second calculating unit 24, and a third recording unit 25. The second recording unit 23 records a data table of an acceleration-deceleration coefficient A(I) for driving-current-related life consumption speed. The acceleration-deceleration coefficient A(I) is obtained by dividing the life expected of the plurality of laser diode module groups 2 when the plurality of laser diode module groups 2 are driven with a standard driving current $I_s$ by the life expected of the plurality of laser diode module groups 2 when the plurality of laser diode module groups 2 are driven with a driving current I. The second calculating unit 24 calculates a time-integrated value=$\int_{t_a}^{t_b} A(I(t))dt$ from time $t_a$ to time $t_b$ for each of the plurality of laser diode module groups 2. The third recording unit 25 records a first accumulated value=$\int_{t_0}^{t_p} A(I(t))dt$ representing the result of the time integration performed from time $t_0$ up to present time $t_p$ by the second calculating unit 24 for each of the plurality of laser diode module groups 2.

Figure 13:
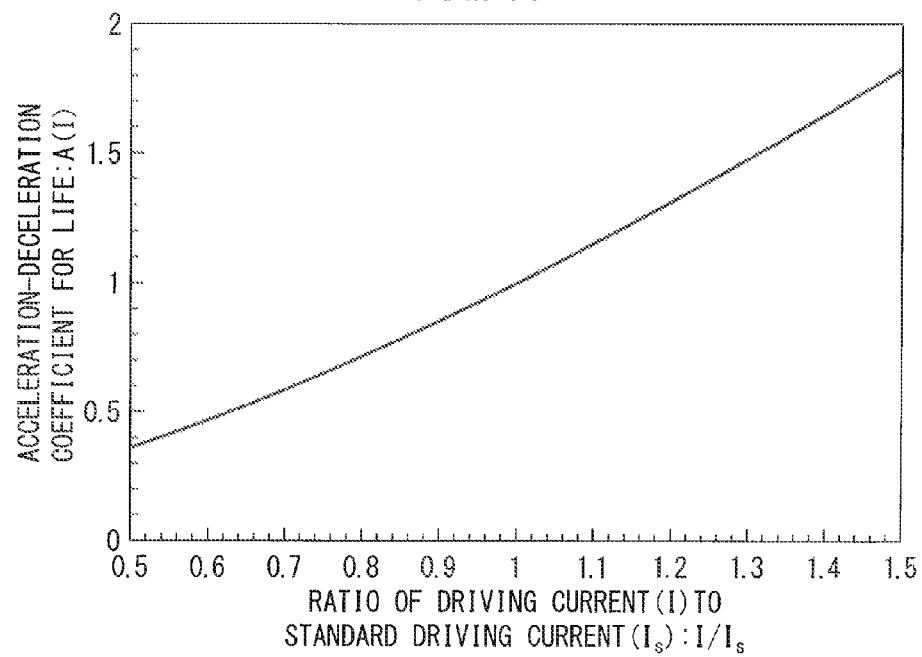
FIG. 13 is a diagram showing an example of an acceleration-deceleration coefficient A(I) for driving-current-related life consumption speed.

When the control unit 19 allocates, in response to the laser beam output power command value, the driving currents to the plurality of respective laser diode module groups 2 so that the plurality of laser diode module groups 2 as a whole can achieve maximum or substantially maximum electrical to optical conversion efficiency under conditions where the commanded optical output power can be obtained, the plurality of laser diode module groups are compared with each other, and at least one of the plurality of laser diode module groups for which the first accumulated value is relatively small is preferentially selected as one of the plurality of laser diode module groups to which the driving currents are to be allocated. The data table of the acceleration-deceleration coefficient for driving-current-related life consumption speed, A(I), recorded in the second recording unit 23, is a data table such as shown in FIG. 13.

Since the life of the laser diode modules is greatly affected by the driving current, the first accumulated value accounting for the acceleration-deceleration coefficient for life consumption speed due to the magnitude of the driving current is considered to represent the accumulated load or the effective accumulated driving time. Accordingly, by preferentially selecting the laser diode module groups for which the first accumulated value is small as the laser diode module groups to which the driving currents are to be allocated, the accumulated load is equally distributed over the laser diode module groups. This serves to avoid reducing the life of a limited number of laser diode module groups, and the life of the laser diode module groups as a whole, and hence the life of the laser apparatus, can be extended as long as possible.

Fourth Embodiment

Figure 14:
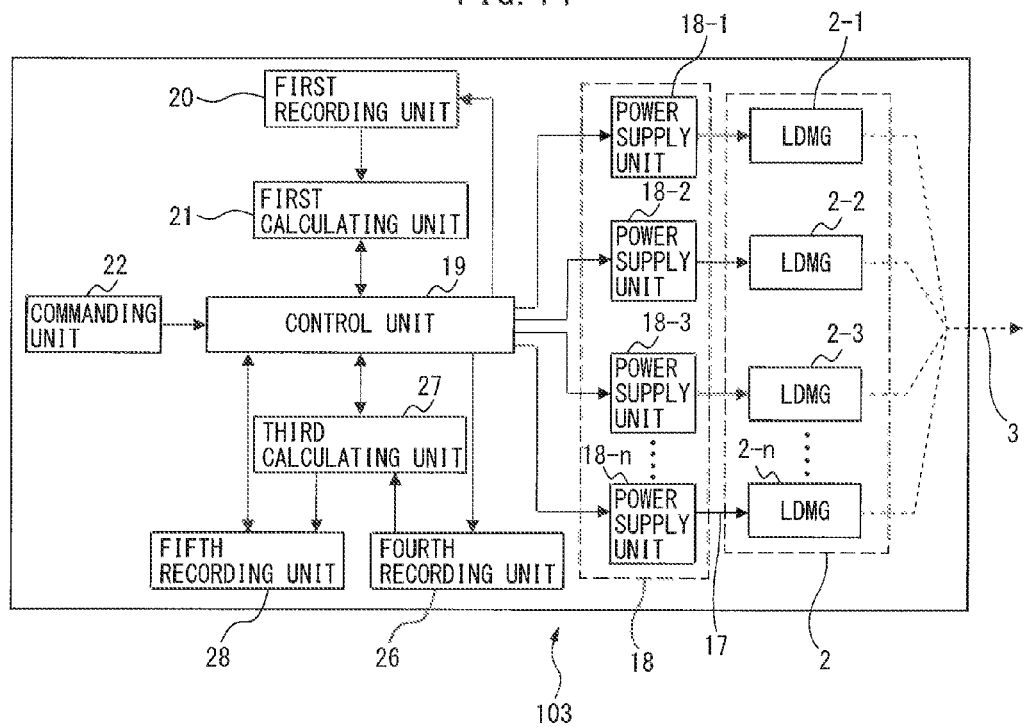
FIG. 14 is a schematic diagram showing the configuration of a laser apparatus according to a fourth embodiment of the present invention.

FIG. 14 is a schematic diagram showing the configuration of a laser apparatus for explaining a laser apparatus 103 according to a fourth embodiment of the present invention.

The laser apparatus 103 according to the fourth embodiment of the present invention comprises a fourth recording unit 26, a third calculating unit 27, and a fifth recording unit 28. The fourth recording unit 26 records a data table of an acceleration-deceleration coefficient B(I) for optical-output-related life consumption speed. The acceleration-deceleration coefficient B(I) is obtained by dividing the life expected of the plurality of laser diode module groups 2 when the plurality of laser diode module groups 2 are driven with a standard optical output power $P_s$ by the life expected of the plurality of laser diode module groups 2 when the plurality of laser diode module groups 2 are driven with an optical output power P. The third calculating unit 27 calculates a time-integrated value=$\int_{t_a}^{t_b} B(P(t))dt$ from time $t_a$ to time $t_b$ for each of the plurality of laser diode module groups 2. The fifth recording unit 28 records a second accumulated value=$\int_{t_0}^{t_p} B(P(t))dt$ representing the result of the time integration performed from time $t_0$ up to present time $t_p$ by the third calculating unit 27 for each of the plurality of laser diode module groups 2.

Figure 15:
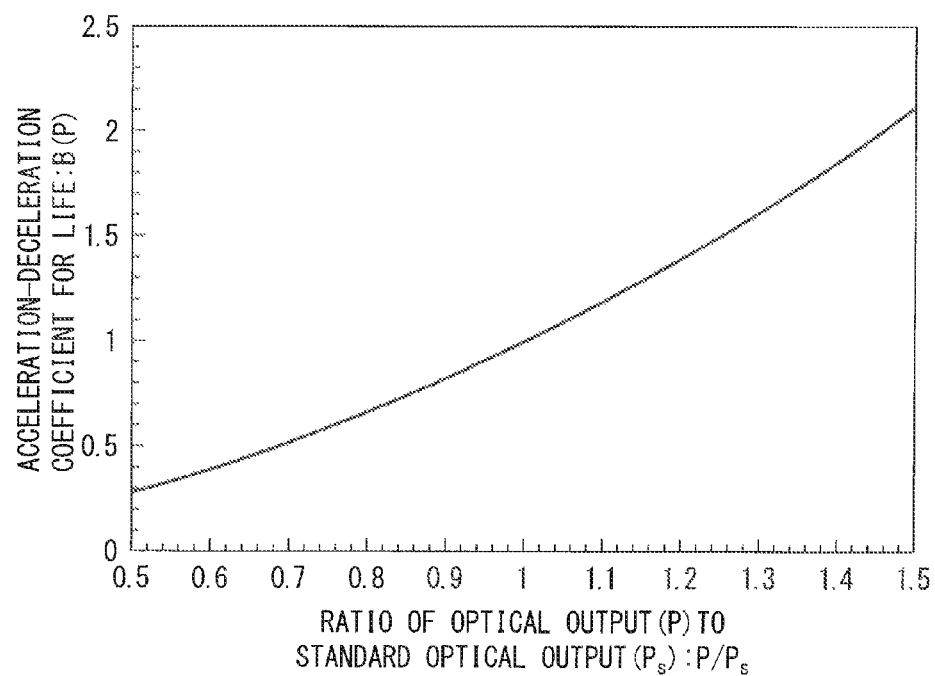
FIG. 15 is a diagram showing an example of an acceleration-deceleration coefficient B(P) for optical-output-related life consumption speed.

When the control unit 19 allocates, in response to the laser beam output power command value, the driving currents to the plurality of respective laser diode module groups 2 so that the plurality of laser diode module groups 2 as a whole can achieve maximum or substantially maximum electrical to optical conversion efficiency under conditions where the commanded optical output power can be obtained, the plurality of laser diode module groups are compared with each other, and at least one of the plurality of laser diode module groups for which the second accumulated value is relatively small is preferentially selected as one of the plurality of laser diode module groups to which the driving currents are to be allocated. The data table of the acceleration-deceleration coefficient for optical-output-related life consumption speed, B(P), recorded in the fourth recording unit 26, is a data table such as shown in FIG. 15.

There are cases where the life of the laser diode modules is affected to a greater extent by the optical output power than by the driving current. In such cases, the laser diode module groups to which the driving currents are to be allocated are preferentially selected based on the second accumulated value accounting for the acceleration-deceleration coefficient for life consumption speed due to the magnitude of the optical output power; by so doing, the accumulated load can be even more equally distributed over the laser diode module groups than in the third embodiment.

Fifth Embodiment

Figure 16:
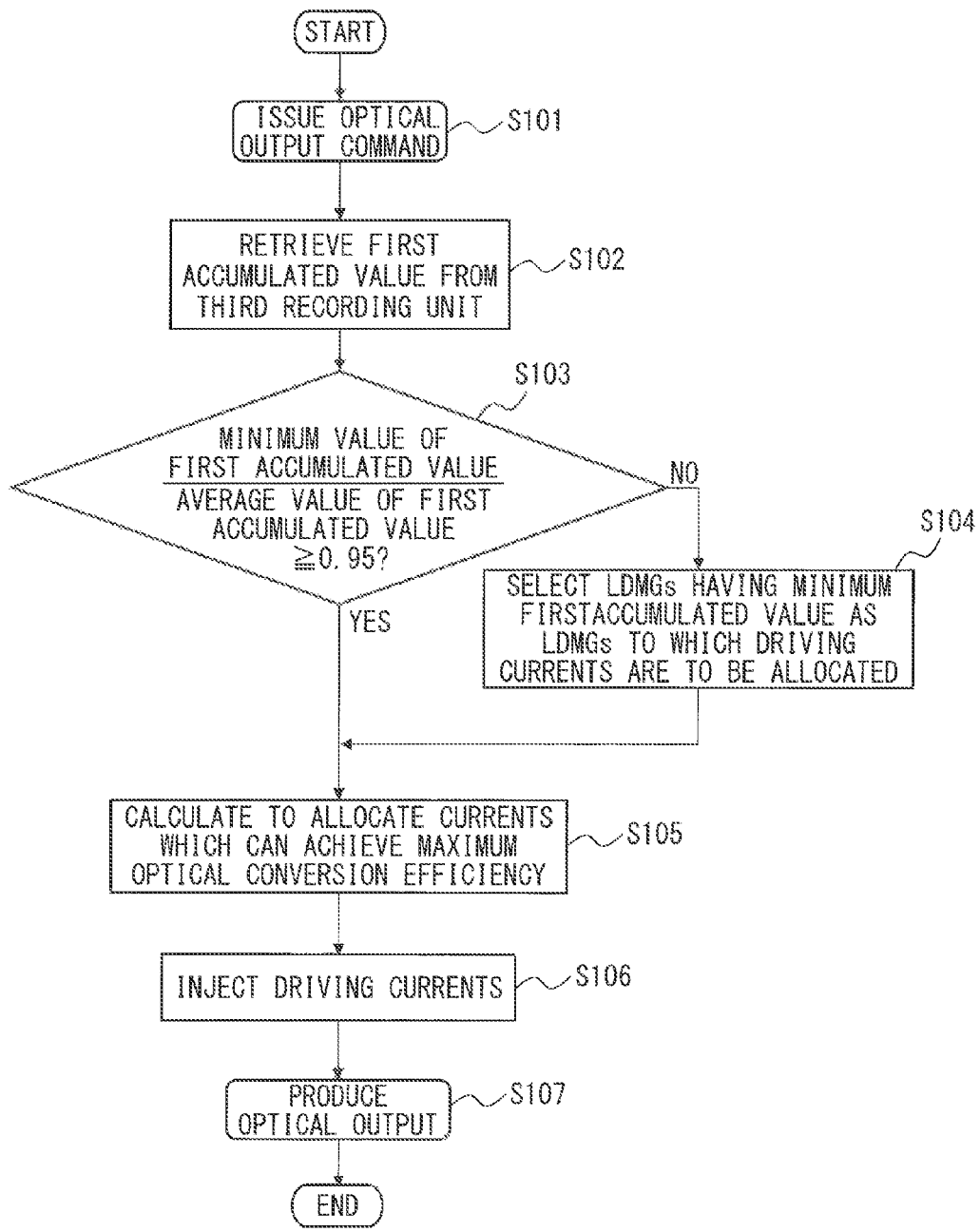
FIG. 16 is a diagram for explaining a sequence of operations in a laser apparatus according to a fifth embodiment of the present invention by way of a flowchart illustrating a method of selecting laser diode module groups to which driving currents are to be allocated.

FIG. 16 is a diagram for explaining a laser apparatus according to a fifth embodiment of the present invention by way of a flowchart illustrating a method of selecting laser diode module groups to which driving currents are to be allocated. First, in step S101, the commanding unit 22 (see FIG. 12) issues a laser beam output power command value to the control unit 19.

Next, in step S102, the first accumulated value=$\int_{t_0}^{t_p} A(I(t))dt$ representing the result of the time integration performed from time $t_0$ up to present time $t_p$ by the second calculating unit 24 for each of the plurality of laser diode module groups 2 is retrieved from the third recording unit 25.

Next, in step S103, it is determined whether or not the first accumulated value of a plurality of laser diode module groups for which the first accumulated value is the smallest is either equal to or larger than 95% of the average first accumulated value taken over all of the plurality of laser diode module groups. If the first accumulated value of the plurality of laser diode module groups for which the first accumulated value is the smallest is smaller than 95% of the average first accumulated value taken over all of the plurality of laser diode module groups, then in step S104 the laser diode module groups (LDMGs) having the minimum first accumulated value are selected as the module groups to which the driving currents are to be allocated.

In this way, a situation is considered where the difference or ratio between the first accumulated values of the plurality of laser diode module groups has expanded beyond a predetermined value. For example, in FIG. 16, a situation is considered where the difference between the first accumulated value of the plurality of laser diode module groups for which the first accumulated value is the smallest and the average first accumulated value taken over all of the plurality of laser diode module groups has expanded to 5% or greater. That is, if the first accumulated value of the plurality of laser diode module groups for which the first accumulated value is the smallest is smaller than 95% of the average first accumulated value taken over all of the plurality of laser diode module groups, then in response to the laser beam output power command value issued to the laser apparatus the first calculating unit 21 and the control unit 19 allocate the driving currents to the plurality of respective laser diode module groups so that the plurality of laser diode module groups as a whole can achieve maximum electrical to optical conversion efficiency under conditions where the commanded optical output power can be obtained and under conditions where the plurality of laser diode module groups whose first accumulated value is 95% or less are selected as the plurality of laser diode module groups to which the driving currents are to be allocated (step S105). Next, in step S106, the driving currents are injected into the plurality of respective laser diode module groups, and in step S107, the optical output power is produced.

Suppose that the condition that at least one of the plurality of laser diode module groups into which the driving currents are to be injected were to be selected so as to achieve the highest electrical to optical conversion efficiency for the plurality of laser diode module groups as a whole is always set as the first priority selection criterion. Then, in this case, the plurality of laser diode module groups having high electrical to optical conversion efficiency continue to be selected until they deteriorate to a discernible level. As a result, with the method of the third embodiment alone, there is a risk that the accumulated load will be excessively concentrated on a limited number of laser diode module groups and the end of life may vary among the plurality of laser diode module groups. To avoid this risk, priority is given to resolving the concentration of the accumulated load when the accumulated load is concentrated to a greater degree than a predetermined degree.

Sixth Embodiment

Figure 17:
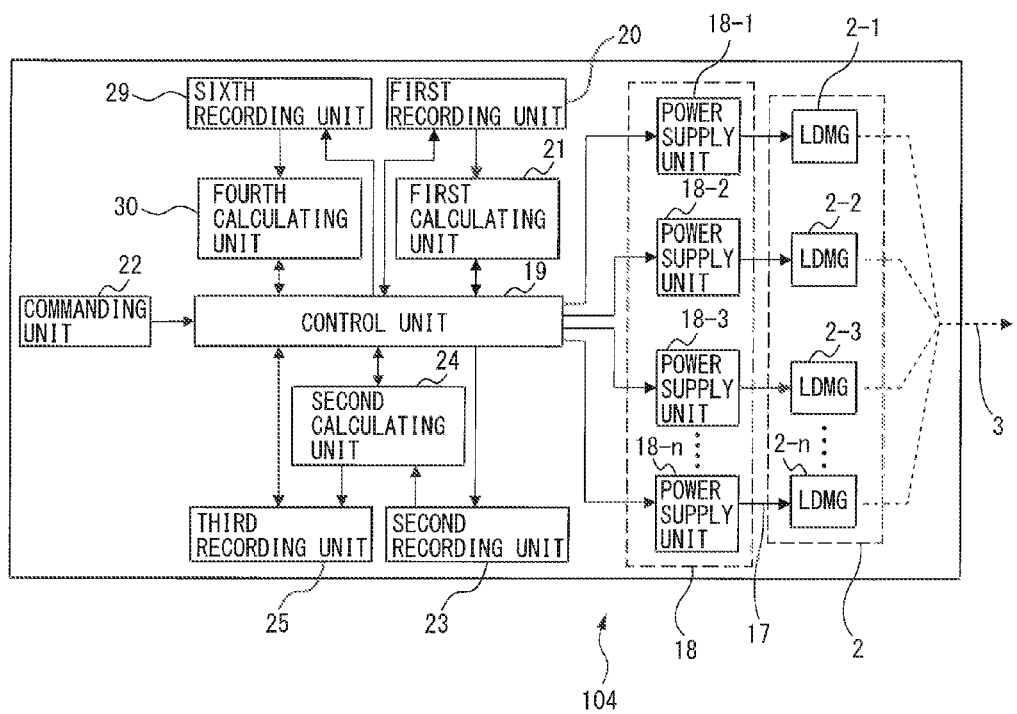
FIG. 17 is a schematic diagram showing the configuration of a laser apparatus according to a sixth embodiment of the present invention.

FIG. 17 is a schematic diagram showing the configuration of a laser apparatus for explaining a laser apparatus 104 according to a sixth embodiment of the present invention. The laser apparatus 104 according to the sixth embodiment of the present invention defines the electrical to optical conversion efficiency in terms of a first performance characteristic calculated for each of the plurality of laser diode module groups 2 from the optical output power characteristic data and/or the current-voltage characteristic data recorded in the first recording unit 20 for each of the plurality of laser diode module groups 2. The laser apparatus 104 according to the sixth embodiment of the present invention comprises: a sixth recording unit 29 in which is recorded a data table providing correlation between the electrical to optical conversion efficiency and remaining life for each of the plurality of laser diode module groups 2; and a fourth calculating unit 30 which calculates a correction coefficient C by dividing the remaining life of the plurality of laser diode module groups having standard electrical to optical conversion efficiency by the remaining life estimated from the electrical to optical conversion efficiency measured for each of the plurality of laser diode module groups 2 and the data table recorded in the sixth recording unit 29 as providing correlation between the electrical to optical conversion efficiency and remaining life.

The second calculating unit 24 not only calculates the time-integrated value=$\int_{t_a}^{t_b} A(I(t))dt$ for each of the plurality of laser diode module groups, but also calculates a time-integrated value=$\int_{t_a}^{t_b} C \cdot A(I(t))dt$ by multiplying with the correction coefficient C. The third recording unit 25 records the value $\int_{t_0}^{t_b} C \cdot A(I(t))dt$ as a third accumulated value, in addition to the first accumulated value.

When the control unit 19 allocates the driving currents to the plurality of respective laser diode module groups 2, the plurality of laser diode module groups are compared with each other, and at least one of the plurality of laser diode module groups 2 for which the third accumulated value is relatively small is preferentially selected as one of the laser diode module groups 2 to which the driving currents are to be allocated, rather than preferentially selecting at least one of the plurality of laser diode module groups for which the first accumulated value is relatively small.

Figure 18:
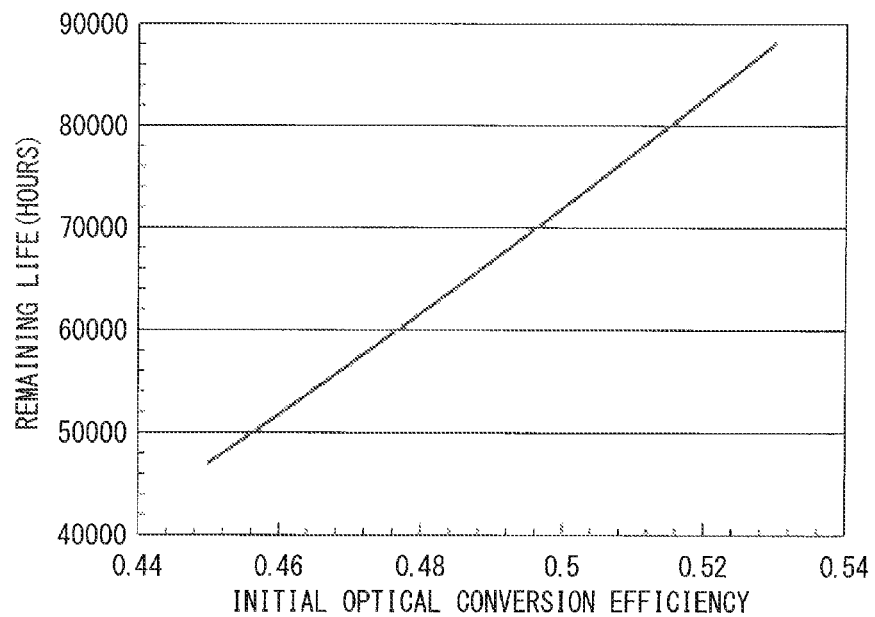
FIG. 18 is a diagram showing an example of a relationship between electrical to optical conversion efficiency and estimated remaining life for each laser diode module group.
Figure 19:
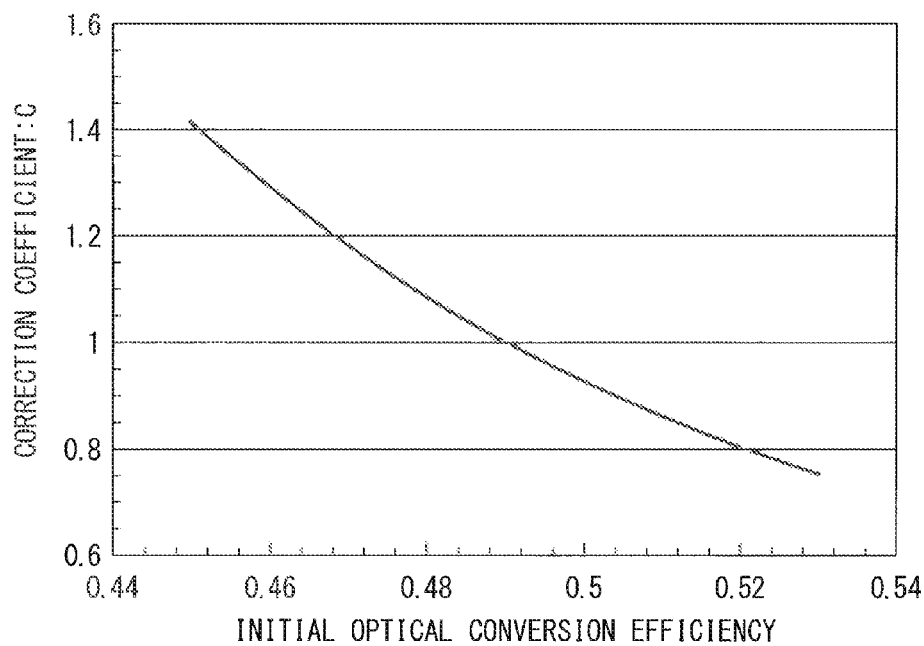
FIG. 19 is a diagram showing a correction coefficient C calculated from the relationship shown in FIG. 18.

When the first performance characteristic of each of the plurality of laser diode module groups 2 is recorded as the electrical to optical conversion efficiency in the sixth recording unit 29, the data table providing correlation between the first performance characteristic and remaining life for each of the plurality of laser diode module groups 2 is a data table such as shown in FIG. 18. The correction coefficient C calculated based on the data table of FIG. 18 is as shown in FIG. 19.

For any laser diode module group whose remaining life is estimated to be relatively short for such reasons as low electrical to optical conversion efficiency, the third accumulated value calculated by accounting for the individual life difference of the laser diode module group becomes correspondingly large. The laser diode module groups to which the driving currents are to be allocated are selected based on the thus calculated third accumulated value. Since this reduces the chance of selecting any laser diode module group whose remaining life is estimated to be relatively short, the life of the laser diode module groups as a whole can be extended.

Seventh Embodiment

Figure 20:
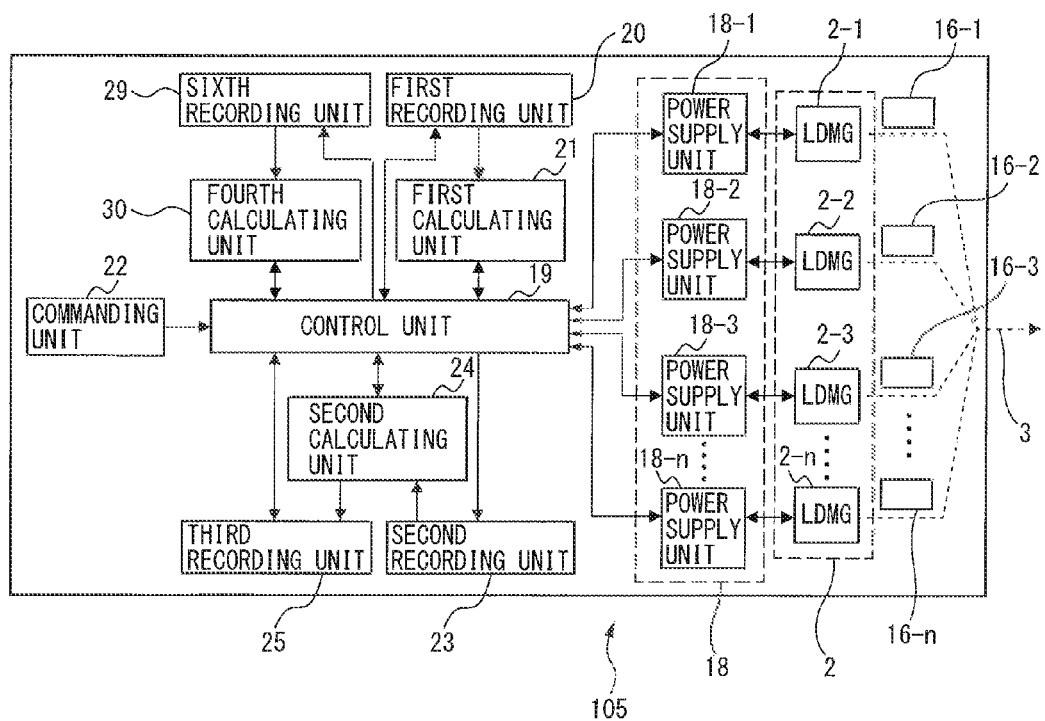
FIG. 20 is a schematic diagram showing the configuration of a laser apparatus according to a seventh embodiment of the present invention.

FIG. 20 is a schematic diagram showing the configuration of a laser apparatus for explaining a laser apparatus 105 according to a seventh embodiment of the present invention. The laser apparatus 105 according to the seventh embodiment of the present invention has a configuration capable of, in response to a command from the control unit 19, making measurements repeatedly in accordance with a time schedule set up for at least one of the optical output power characteristic representing the relationship between the driving current and optical output power for each of the plurality of laser diode module groups 2 and the current-voltage characteristic representing the relationship between the driving current and driving voltage for each of the plurality of laser diode module groups 2. The laser apparatus 105 further includes the configuration and function for updating, using the optical output power characteristic and/or the current-voltage characteristic measured in response to the command from the control unit 19, the optical output power characteristic data and/or the current-voltage characteristic data recorded in the first recording unit 20 for each of the plurality of laser diode module groups 2.

In the present embodiment, the optical output power characteristic representing the relationship between the driving current and optical output power for each of the plurality of laser diode module groups 2 is obtained using a corresponding one of optical output power monitors 16-1, 16-2, 16-3, . . . , 16-n provided for the plurality of respective laser diode module groups. However, the optical output power monitors 16-1, 16-2, 16-3, . . . , 16-n need not necessarily be placed as illustrated in this example, but may be placed in a light path that follows the path where the laser beam from the laser diode module groups is combined. While the wiring lines are not shown in FIG. 20, the optical output power monitors are controlled by the control unit 19, and a signal from each optical output power monitor is processed by the control unit 19 and the processed signal is used to update the optical output power characteristic of a corresponding one of the plurality of laser diode module groups 2 recorded in the first recording unit 20. Further, the applied voltage that varies with the driving current is fed back to the control unit 19 and is used to update the current-voltage characteristic data of a corresponding one of the plurality of laser diode module groups 2 recorded in the first recording unit 20.

According to the laser apparatus of the present embodiment, by repeatedly updating the optical output power characteristic and/or the current-voltage characteristic of each of the plurality of laser diode module groups 2, the driving current can be accurately allocated to each laser diode module group in response to the optical output power command value so that the plurality of laser diode module groups 2 as a whole can be driven with maximum electrical to optical conversion efficiency, and thus, the optical output power can be produced accurately as commanded.

Eighth Embodiment

Figure 21:
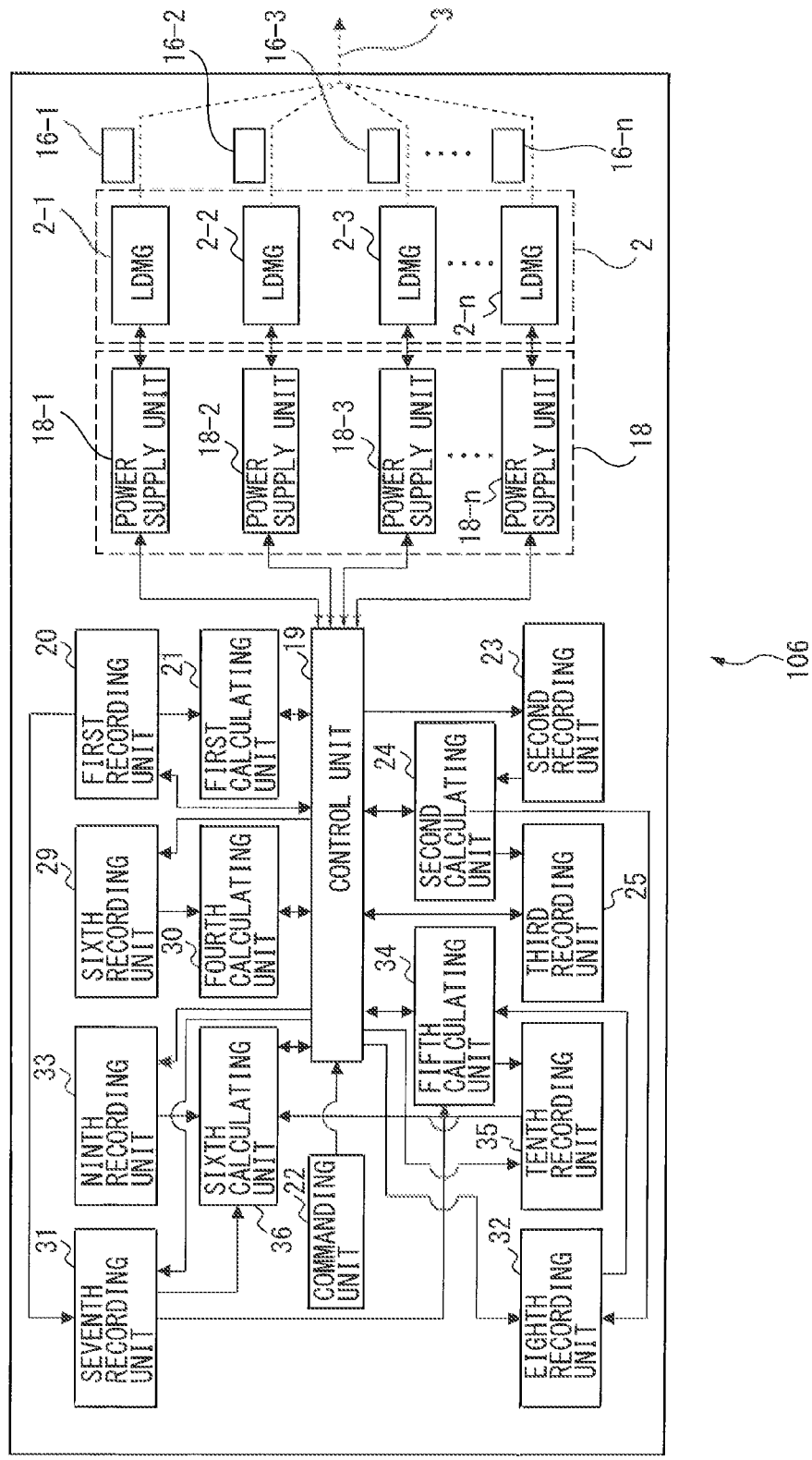
FIG. 21 is a schematic diagram showing the configuration of a laser apparatus according to an eighth embodiment of the present invention.

FIG. 21 is a schematic diagram showing the configuration of a laser apparatus for explaining a laser apparatus 106 according to an eighth embodiment of the present invention.

The laser apparatus 106 according to the eighth embodiment of the present invention comprises, in addition to the first recording unit 20 which records the latest optical output power characteristic and current-voltage characteristic measured at time $t_2$ for each of the plurality of laser diode module groups 2, a seventh recording unit 31 which records the optical output power characteristic and current-voltage characteristic measured at a given past time $t_1$ for each of the plurality of laser diode module groups 2, and an eighth recording unit 32 which records a time-integrated value=$\int_{t_1}^{t_2} A(I(t))dt$ calculated from the time $t_1$ to the time $t_2$ by the second calculating unit 24.

The laser apparatus 106 according to the eighth embodiment of the present invention further comprises: a ninth recording unit 33 in which is recorded a data table of a deterioration curve depicting a progression of deterioration with driving time for a second performance characteristic E(t) calculated from the optical output power characteristic and/or current-voltage characteristic of the plurality of laser diode module groups; a fifth calculating unit 34 which calculates the speed of deterioration of the second performance characteristic by dividing the amount of deterioration $|E(t_1)-E(t_2)|$ of the second performance characteristic E(t) by the time-integrated value=$\int_{t_1}^{t_2} A(I(t))dt$; a tenth recording unit 35 which records the speed of deterioration of the second performance characteristic calculated by the fifth calculating unit 34; and a sixth calculating unit 36 which calculates a correction coefficient D by dividing the average remaining life taken over all the plurality of laser diode module groups 2 by the remaining life of each of the plurality of laser diode module groups 2 estimated based on the second performance characteristic measured at the time $t_2$, the speed of deterioration of the second performance characteristic, and the deterioration curve of the second performance characteristic recorded in the ninth recoding unit 33.

Figure 22:
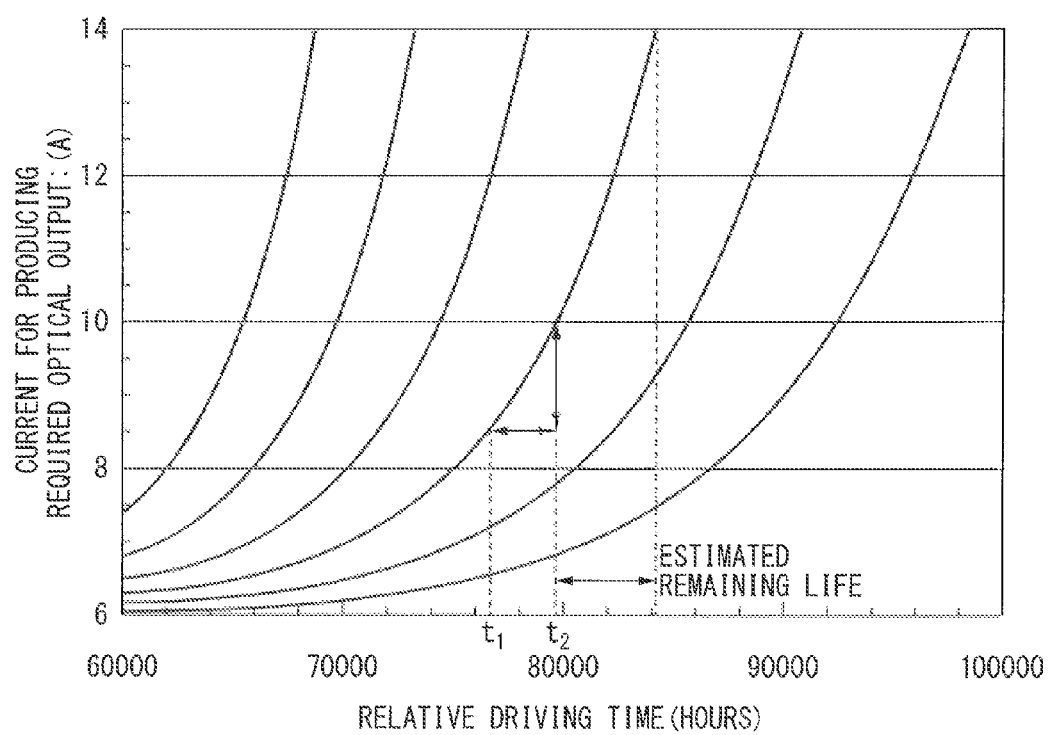
FIG. 22 is a diagram showing a method of estimating the remaining life of each laser diode module group from an increase in the driving current required to produce a required optical output power.

The second performance characteristic E(t) calculated from the optical output power characteristic and/or current-voltage characteristic of each laser diode module group is taken as the driving current value for producing the required optical output power from the laser diode module group. Then, the data table of the deterioration curve depicting the progression of deterioration of the second performance characteristic with the driving time, recorded in the ninth recording unit 33, is as shown in FIG. 22. A method of estimating the remaining life of each laser diode module group based on the second performance characteristic measured at the time $t_2$, the speed of deterioration of the second performance characteristic, and the deterioration curve of the second performance characteristic recorded in the ninth recoding unit 33 will be described in detail below. As illustrated in FIG. 22, the driving current value for producing the required optical output power at time $t_1$ is 8.5 A. On the other hand, the driving current value for producing the required optical output power at time $t_2$ is 10 A.

Assuming that the time-integrated value=$\int_{t_1}^{t_2} A(I(t))dt$ is 3000 hours, the length of the vertical arrow represents the amount of deterioration $|E(t_1)-E(t_2)|$ of the second performance characteristic E(t)=1.5 A. On the other hand, the length of the horizontal arrow represents the time-integrated value=$\int_{t_1}^{t_2} A(I(t))dt$=3000 hours. The speed of deterioration is calculated by dividing the amount of deterioration $|E(t_1)-E(t_2)|$ of the second performance characteristic E(t) by the time-integrated value=$\int_{t_1}^{t_2} A(I(t))dt$.

A deterioration curve is found for which the slope at the driving current value 10 A for producing the required optical output power at time $t_2$ coincides with the speed of deterioration. Then, from the driving current value 10 A for producing the required optical output power at time $t_2$ on that deterioration curve, the remaining life of the laser diode module group can be estimated. Suppose that the laser diode module group is determined to have come to the end of its life when the driving current value necessary for producing the required optical output power has increased up to 14 A; then, in this case, the estimated remaining life is calculated to be about 4600 hours by subtracting 79,600 hours from 84,200 hours, as illustrated in FIG. 22.

Since the remaining life can be determined for each laser diode module group as described above, the sixth calculating unit 36 can calculate the correction coefficient D which is the value obtained by dividing the average remaining life taken over all the plurality of laser diode module groups by the remaining life of each individual laser diode module group.

Then, after a time at which the speed of deterioration exceeds a predetermined value or after time $t_3$ at which the remaining life becomes shorter than a predetermined number of hours, the second calculating unit 24 calculates a time-integrated value=$\int_{t_a}^{t_b} D \cdot A(I(t))dt$ by multiplying with the correction coefficient D. Further, the third recording unit 25 records, in addition to the first accumulated value, the third accumulated value by adding $\int_{t_3}^{t_b} D \cdot A(I(t))dt$ to the accumulated value of the third accumulated values up to that time $t_3$.

When the control unit 19 allocates the driving current to each of the laser diode module groups, the laser diode module groups are compared with each other, and laser diode module groups for which the third accumulated value is relatively small are preferentially selected as the laser diode module groups to which the driving currents are to be allocated, rather than preferentially selecting the laser diode module groups for which the first accumulated value is relatively small.

When the laser diode module group enters the final stage of its life, and the deterioration of its performance characteristic becomes obvious, the remaining life can be estimated with higher accuracy from the speed of deterioration. For any laser diode module group whose remaining life is estimated to be relatively short from its performance characteristic and the speed of deterioration, the third accumulated value calculated by accounting for the remaining life becomes correspondingly large. Therefore, the laser diode module groups to which the driving currents are to be allocated are selected based on the thus calculated third accumulated value. Since this reduces the chance of selecting any laser diode module group whose remaining life is estimated to be relatively short, the life of the laser diode module groups as a whole can be further extended.

In the above embodiments, the laser apparatus has been described as including the first recording unit 20 to the tenth recording unit 35 as the recording units. However, the plurality of recording units need not necessarily be physically separate memories, but may be implemented using a single memory. Likewise, the plurality of calculating units have been described as being independent units, but a single processor may be configured to implement the functions of the plurality of calculating units. That is, the functions of all the recording units and the functions of all the calculating units described in the above embodiments of the laser apparatus may be implemented using a single memory and a single processor, respectively.

In the embodiments other than the fourth embodiment, no mention has been made of B(P) which is the acceleration-deceleration coefficient for optical-output-related life consumption speed, but in the fifth and subsequent embodiments also, it is self-evident that the laser apparatus can be constructed by replacing A(I) with B(P), the first accumulated value with the second accumulated value, the second recording unit 23 with the fourth recording unit 26, the third recording unit 25 with the fifth recording unit 28, and so on, and this can be achieved with exactly the same configuration by simply modifying the control method.

According to a laser apparatus of one embodiment of the present invention, laser diodes can always be driven under conditions of the highest possible electrical to optical conversion efficiency over a wide optical output power command value range.

According to a laser apparatus of another embodiment of the present invention, the life of the laser apparatus can be extended as long as possible by solving the problem that the load due to driving is concentrated on a limited number of laser diode module groups, resulting in variations in remaining life among the laser diode module groups with some of the laser diode module groups coming to the end of their life earlier than the others, and thus reducing the life of the laser apparatus as a whole.

The invention claimed is:

1. A laser apparatus which includes a plurality of laser diode module groups each containing at least one laser diode module, and a plurality of power supply units each for supplying a driving current to a corresponding one of the plurality of laser diode module groups, and which provides a laser light source or a pumping light source for laser oscillation by collecting laser beam from the plurality of laser diode module groups, the laser apparatus comprising:
   a driving current supply circuit network which is capable of injecting the driving currents from the plurality of power supply units into the plurality of respective laser diode module groups, independently for each of the plurality of laser diode module groups;

a control unit which controls the driving currents to be injected from the plurality of power supply units into the plurality of respective laser diode module groups, independently for each of the plurality of laser diode module groups;

a first recording unit in which are recorded optical output power characteristic data representing a relationship between the driving current and optical output power for each of the plurality of laser diode module groups and current-voltage characteristic data representing a relationship between the driving current and drive voltage for each of the plurality of laser diode module groups; and a first calculating unit which, in response to a laser beam output power command to the laser apparatus, calculates the driving currents to be allocated to the plurality of respective laser diode module groups so that the plurality of laser diode module groups as a whole can achieve maximum or substantially maximum electrical to optical conversion efficiency, wherein the electrical to optical conversion efficiency represents energy conversion efficiency from injected power to optical output power, under conditions where the commanded optical output power can be obtained, and wherein in response to the laser beam output power command to the laser apparatus, the control unit allocates the driving currents to the plurality of respective laser diode module groups in accordance with results calculated by the first calculating unit based on the data recorded in the first recording unit so that the plurality of laser diode module groups as a whole can achieve maximum or substantially maximum electrical to optical conversion efficiency under conditions where the commanded optical output power can be obtained.

2. The laser apparatus according to claim 1, wherein when the laser beam output power command to the laser apparatus is a pulse output command such that the optical output power alternates cyclically between a high output power level and a low output power level, the control unit allocates the driving currents to the plurality of respective laser diode module groups so that the plurality of laser diode module groups as a whole can achieve maximum or substantially maximum electrical to optical conversion efficiency under conditions where the commanded optical output power can be obtained, whether the optical output power is a high output power level or a low output power level.

3. The laser apparatus according to claim 1, further comprising:

a second recording unit in which is recorded a data table of an acceleration-deceleration coefficient A(I) for driving-current-related life consumption speed, wherein the acceleration-deceleration coefficient A(I) is obtained by dividing the life expected of the plurality of laser diode module groups when the plurality of laser diode module groups are driven with a standard driving current $I_s$ by the life expected of the plurality of laser diode module groups when the plurality of laser diode module groups are driven with a driving current I;

a second calculating unit which calculates a time-integrated value=$\int_{t_a}^{t_b} A(I(t))dt$ from time $t_a$ to time $t_b$ for each of the plurality of laser diode module groups; and a third recording unit which records a first accumulated value=$\int_{t_0}^{t_p} A(I(t))dt$ representing a result of the time integration performed up to present time $t_p$ by the second calculating unit for each of the plurality of laser diode module groups, and wherein:

when the control unit allocates, in response to the laser beam output power command, the driving currents to the plurality of respective laser diode module groups so that the plurality of laser diode module groups as a whole can achieve maximum or substantially maximum electrical to optical conversion efficiency under conditions where the commanded optical output power can be obtained, the plurality of laser diode module groups are compared with each other, and at least one of the plurality of laser diode module groups for which the first accumulated value is relatively small is preferentially selected as one of the plurality of laser diode module groups to which the driving currents are to be allocated.

4. The laser apparatus according to claim 3, wherein when a difference or ratio between the first accumulated values of the plurality of laser diode module groups has expanded beyond a predetermined value, the first calculating unit and the control unit, in response to the laser beam output power command issued to the laser apparatus, allocate the driving currents to the plurality of respective laser diode module groups so that the plurality of laser diode module groups as a whole can achieve maximum electrical to optical conversion efficiency under conditions where the commanded optical output power can be obtained and under conditions where at least one of the plurality of laser diode module groups for which the first accumulated value is found to be relatively small as a result of comparing the plurality of laser diode module groups is selected as at least one of the plurality of laser diode module groups to which the driving currents are to be allocated.

5. The laser apparatus according to claim 3, further comprising:

a sixth recording unit in which is recorded a data table providing correlation between remaining life of each of the plurality of laser diode module groups and a first performance characteristic of each of the plurality of laser diode module groups, wherein the first performance characteristic is calculated from the optical output power characteristic data and/or the current-voltage characteristic data recorded in the first recording unit for each of the plurality of laser diode module groups; and a fourth calculating unit which calculates a correction coefficient C by dividing the remaining life of the plurality of laser diode module groups having standard first performance characteristic by the remaining life estimated from the first performance characteristic measured for each of the plurality of laser diode module groups and the data table recorded in the sixth recording unit, and wherein:

the second calculating unit not only calculates the time-integrated value=$\int_{t_a}^{t_b} A(I(t))dt$ for each of the plurality of laser diode module groups, but also calculates a time-integrated value=$\int_{t_a}^{t_b} C \cdot A(I(t))dt$ by multiplying with the correction coefficient C, and the third recording unit records the value $\int_{t_0}^{t_p} C \cdot A(I(t))dt$ as a third accumulated value, in addition to the first accumulated value, and wherein when the control unit allocates the driving currents to the plurality of respective laser diode module groups, the plurality of laser diode module groups are compared with each other, and at least one of the plurality of laser diode module groups for which the third accumulated value is relatively small is preferentially selected as one of the laser diode module groups to which the driving currents are to be allocated, rather than preferentially selecting at least one of the plurality of laser diode module groups for which the first accumulated value is relatively small.

6. The laser apparatus according to claim 5, further comprising, in addition to the first recording unit which records the latest optical output power characteristic and current-voltage characteristic measured at time $t_2$ for each of the plurality of laser diode module groups,
- a seventh recording unit which records the optical output power characteristic and current-voltage characteristic measured at a given previous time $t_1$ for each of the plurality of laser diode module groups, and
- an eighth recording unit which records a time-integrated value=$\int_{t_1}^{t_2} A(I(t))dt$ calculated from the time $t_1$ to the time $t_2$ by the second calculating unit, and wherein:

the laser apparatus further comprises
- a ninth recording unit in which is recorded a data table of a deterioration curve depicting a progression of deterioration with driving time for a second performance characteristic $E(t)$ calculated from the optical output power characteristic and/or the current-voltage characteristic of the plurality of laser diode module groups,
- a fifth calculating unit which calculates a speed of deterioration of the second performance characteristic by dividing the amount of deterioration $|E(t_1)-E(t_2)|$ of the second performance characteristic by the time-integrated value=$\int_{t_1}^{t_2} A(I(t))dt$,
- a tenth recording unit which records the speed of deterioration of the second performance characteristic calculated by the fifth calculating unit, and
- a sixth calculating unit which calculates a correction coefficient D by dividing an average remaining life taken over all the plurality of laser diode module groups by the remaining life of each of the plurality of laser diode module groups estimated based on the second performance characteristic measured at the time $t_2$, the speed of deterioration of the second performance characteristic, and the deterioration curve of the second performance characteristic recorded in the ninth recoding unit, wherein after a time at which the speed of deterioration exceeds a predetermined value or after time $t_3$ at which the remaining life becomes shorter than a predetermined number of hours, the second calculating unit calculates a time-integrated value=$\int_{t_a}^{t_p} D \cdot A(I(t))dt$ by multiplying with the correction coefficient D, and the third recording unit records, in addition to the first accumulated value, the third accumulated value by adding $\int_{t_3}^{t_p} D \cdot A(I(t))dt$ to the accumulated value of the third accumulated values up to that time $t_3$, and wherein when the control unit allocates the driving currents to the plurality of respective laser diode module groups, the laser diode module groups are compared with each other, and at least one of the plurality of laser diode module groups for which the third accumulated value is relatively small is preferentially selected as one of the laser diode module groups to which the driving currents are to be allocated, rather than preferentially selecting at least one of the plurality of laser diode module groups for which the first accumulated value is relatively small.

7. The laser apparatus according to claim 1, further comprising:
- a fourth recording unit in which is recorded a data table of an acceleration-deceleration coefficient B(P) for optical-output-related life consumption speed, wherein the acceleration-deceleration coefficient B(P) is obtained by dividing the life expected of the plurality of laser diode module groups when the plurality of laser diode module groups are driven with a standard optical output power $P_s$ by the life expected of the plurality of laser diode module groups when the plurality of laser diode module groups are driven with an optical a output power P;
- a third calculating unit which calculates a time-integrated value=$\int_{t_a}^{t_b} B(P(t))dt$ from time $t_a$ to time $t_b$ for each of the plurality of laser diode module groups 2; and
- a fifth recording unit which records a second accumulated value=$\int_{t_0}^{t_p} B(P(t))dt$ representing the result of the time integration performed up to present time $t_p$ by the third calculating unit for each of the plurality of laser diode module groups, and wherein:

when the control unit allocates, in response to the laser beam output power command, the driving currents to the plurality of respective laser diode module groups so that the plurality of laser diode module groups as a whole can achieve maximum or substantially maximum electrical to optical conversion efficiency under conditions where the commanded optical output power can be obtained, the plurality of laser diode module groups are compared with each other, and at least one of the plurality of laser diode module groups for which the second accumulated value is relatively small is preferentially selected as one of the plurality of laser diode module groups to which the driving currents are to be allocated.

8. The laser apparatus according to claim 1, wherein the laser apparatus has a configuration capable of, in response to a command from the control unit, making measurements repeatedly in accordance with a time schedule set up for at least one of an optical output power characteristic representing the relationship between the driving current and optical output power for each of the plurality of laser diode module groups and a current-voltage characteristic representing the relationship between the driving current and drive voltage for each of the plurality of laser diode module groups, and wherein
the optical output power characteristic data and/or the current-voltage characteristic data recorded in the first recording unit for each of the plurality of laser diode module groups is updated using the optical output power characteristic and/or the current-voltage characteristic measured in response to the command from the control unit.

* * * * *